(12) United States Patent
Northcott et al.

(10) Patent No.: US 9,026,867 B1
(45) Date of Patent: May 5, 2015

(54) SYSTEMS AND METHODS FOR ADAPTING TO CHANGING CHARACTERISTICS OF MULTI-LEVEL CELLS IN SOLID-STATE MEMORY

(71) Applicant: PMC-Sierra, Inc., Sunnyvale, CA (US)

(72) Inventors: Philip Lyon Northcott, Coquitlam (CA); Peter Graumann, Calgary (CA); Stephen Bates, Canmore (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 110 days.

(21) Appl. No.: 13/844,499

(22) Filed: Mar. 15, 2013

(51) Int. Cl.
*G11C 29/00* (2006.01)
*G06F 11/07* (2006.01)
*G06F 11/10* (2006.01)
*G06F 11/14* (2006.01)

(52) U.S. Cl.
CPC .............. *G06F 11/076* (2013.01); *G11C 29/00* (2013.01); *G06F 11/1008* (2013.01); *G06F 11/1068* (2013.01); *G06F 11/1004* (2013.01); *G06F 11/14* (2013.01); *G06F 11/1048* (2013.01)

(58) Field of Classification Search
CPC .................................................. G06F 11/1048
USPC ......... 714/763, 773, 704; 365/185.09, 185.33
See application file for complete search history.

(56) References Cited

U.S. PATENT DOCUMENTS

| 4,112,502 A | 9/1978 | Scheuneman |
| 5,404,485 A | 4/1995 | Ban |
| 5,592,497 A | 1/1997 | Lokhoff |
| 5,942,004 A | 8/1999 | Cappelletti |
| 5,956,743 A | 9/1999 | Bruce et al. |
| 5,974,544 A | 10/1999 | Jeffries |
| 6,023,781 A | 2/2000 | Hazama |
| 6,279,133 B1 | 8/2001 | Vafai et al. |
| 6,279,830 B1 | 8/2001 | Ishibashi |
| 6,574,774 B1 | 6/2003 | Vasiliev |
| 6,591,394 B2 | 7/2003 | Lee et al. |
| 6,628,723 B1 | 9/2003 | Gerlach et al. |
| 6,651,212 B1 | 11/2003 | Katayama et al. |
| 6,675,318 B1 | 1/2004 | Lee |
| 6,731,538 B2 | 5/2004 | Noda et al. |
| 6,732,322 B1 | 5/2004 | Miyauchi et al. |

(Continued)

FOREIGN PATENT DOCUMENTS

| JP | 2000149592 | 5/2000 |
| KR | 100766042 | 10/2007 |

(Continued)

OTHER PUBLICATIONS

USPTO; Office Action dated Jan. 2, 2014, from related U.S. Appl. No. 13/477,600, filed May 22, 2012.

(Continued)

*Primary Examiner* — Esaw Abraham
(74) *Attorney, Agent, or Firm* — Knobbe Martens Olson & Bear LLP

(57) ABSTRACT

Apparatus and methods provide relatively low uncorrectable bit error rates, low write amplification, long life, fast and efficient retrieval, and efficient storage density such that a solid-state drive (SSD) can be reliably implemented using various types of memory cells, including relatively inexpensive multi-level cell flash. One embodiment intelligently coordinates remapping of bad blocks with error correction code control, which eliminates the tables used to avoid bad blocks.

20 Claims, 16 Drawing Sheets

(56) References Cited

U.S. PATENT DOCUMENTS

| | | | |
|---|---|---|---|
| 6,732,325 B1 | 5/2004 | Tash et al. | |
| 6,751,766 B2 | 6/2004 | Guterman et al. | |
| 6,839,870 B2 | 1/2005 | Fanfelle | |
| 6,871,303 B2 | 3/2005 | Halter | |
| 6,895,543 B2 | 5/2005 | Hazama | |
| 7,061,804 B2 | 6/2006 | Chun et al. | |
| 7,184,356 B2 | 2/2007 | Noguchi et al. | |
| 7,389,465 B2 | 6/2008 | Radke et al. | |
| 7,415,651 B2 | 8/2008 | Argon | |
| 7,451,383 B2 | 11/2008 | Kim et al. | |
| 7,478,314 B1 | 1/2009 | Cheong et al. | |
| 7,545,689 B2 * | 6/2009 | Ilkbahar et al. | 365/200 |
| 7,643,342 B2 | 1/2010 | Litsyn et al. | |
| 7,739,576 B2 | 6/2010 | Radke | |
| 7,783,955 B2 | 8/2010 | Murin | |
| 7,809,900 B2 | 10/2010 | Danilak | |
| 7,844,879 B2 | 11/2010 | Ramamoorthy et al. | |
| 7,860,200 B2 | 12/2010 | Furman et al. | |
| 7,904,619 B2 | 3/2011 | Danilak | |
| 7,904,672 B2 | 3/2011 | Danilak | |
| 7,904,780 B2 | 3/2011 | Brandman | |
| 7,944,748 B2 | 5/2011 | Eggleston et al. | |
| 7,962,831 B2 | 6/2011 | Park et al. | |
| 8,046,542 B2 | 10/2011 | Radke | |
| 8,051,358 B2 | 11/2011 | Radke | |
| 8,065,583 B2 | 11/2011 | Radke | |
| 8,090,980 B2 | 1/2012 | Danilak | |
| 8,145,855 B2 | 3/2012 | Wan et al. | |
| 8,255,620 B2 * | 8/2012 | Frost et al. | 711/103 |
| 8,335,951 B2 | 12/2012 | Becker et al. | |
| 8,347,138 B2 | 1/2013 | Moshayedi | |
| 8,392,791 B2 | 3/2013 | Saliba et al. | |
| 8,402,217 B2 * | 3/2013 | Burd | 711/114 |
| 8,433,979 B2 * | 4/2013 | Blaum et al. | 714/770 |
| 8,464,095 B1 * | 6/2013 | Bonwick | 714/6.2 |
| 8,495,465 B1 | 7/2013 | Anholt et al. | |
| 8,560,881 B2 * | 10/2013 | Frost et al. | 714/6.2 |
| 8,612,680 B1 | 12/2013 | Madnani et al. | |
| 8,621,318 B1 | 12/2013 | Micheloni et al. | |
| 8,689,082 B2 * | 4/2014 | Oh et al. | 714/773 |
| 8,713,245 B2 * | 4/2014 | Frost et al. | 711/103 |
| 8,713,411 B2 * | 4/2014 | Kong et al. | 714/774 |
| 8,725,944 B2 * | 5/2014 | Burd | 711/114 |
| 8,750,042 B2 * | 6/2014 | Sharon et al. | 365/185.09 |
| 2002/0120820 A1 | 8/2002 | Higuchi et al. | |
| 2002/0159285 A1 | 10/2002 | Morley et al. | |
| 2003/0088821 A1 | 5/2003 | Yokokawa et al. | |
| 2003/0112879 A1 | 6/2003 | Antia et al. | |
| 2003/0156454 A1 | 8/2003 | Wei et al. | |
| 2004/0268065 A1 | 12/2004 | Hilton et al. | |
| 2005/0114587 A1 | 5/2005 | Chou et al. | |
| 2006/0221752 A1 | 10/2006 | Fasoli et al. | |
| 2007/0061689 A1 | 3/2007 | Park et al. | |
| 2007/0124647 A1 | 5/2007 | Chen et al. | |
| 2007/0171714 A1 | 7/2007 | Wu et al. | |
| 2007/0171730 A1 | 7/2007 | Ramamoorthy et al. | |
| 2007/0233752 A1 | 10/2007 | Bangalore et al. | |
| 2007/0266295 A1 | 11/2007 | Conley | |
| 2007/0266296 A1 | 11/2007 | Conley | |
| 2007/0277066 A1 | 11/2007 | Gajapathy et al. | |
| 2008/0010582 A1 | 1/2008 | Nieto et al. | |
| 2008/0034272 A1 | 2/2008 | Wu et al. | |
| 2008/0126680 A1 | 5/2008 | Lee et al. | |
| 2008/0137414 A1 | 6/2008 | Park et al. | |
| 2008/0163023 A1 | 7/2008 | Hong et al. | |
| 2008/0168319 A1 | 7/2008 | Lee et al. | |
| 2008/0172589 A1 | 7/2008 | Gallezot et al. | |
| 2008/0294960 A1 | 11/2008 | Sharon et al. | |
| 2008/0320361 A1 | 12/2008 | Fukuda et al. | |
| 2008/0320373 A1 | 12/2008 | Kim et al. | |
| 2009/0013233 A1 | 1/2009 | Radke | |
| 2009/0013234 A1 | 1/2009 | Radke | |
| 2009/0037627 A1 | 2/2009 | Rofougaran | |
| 2009/0070651 A1 | 3/2009 | Diggs et al. | |
| 2009/0100307 A1 | 4/2009 | Lee | |
| 2009/0113115 A1 | 4/2009 | Nazarian et al. | |
| 2009/0132889 A1 | 5/2009 | Radke | |
| 2009/0164836 A1 | 6/2009 | Carmichael | |
| 2009/0182939 A1 | 7/2009 | Hluchyj et al. | |
| 2009/0327589 A1 | 12/2009 | Moshayedi | |
| 2009/0327840 A1 | 12/2009 | Moshayedi | |
| 2010/0008214 A1 | 1/2010 | Siaud et al. | |
| 2010/0023800 A1 | 1/2010 | Harari et al. | |
| 2010/0115376 A1 | 5/2010 | Shalvi et al. | |
| 2010/0122016 A1 | 5/2010 | Marotta et al. | |
| 2010/0199153 A1 | 8/2010 | Okamura et al. | |
| 2010/0281341 A1 | 11/2010 | Wu et al. | |
| 2010/0332894 A1 | 12/2010 | Bowers et al. | |
| 2010/0332922 A1 | 12/2010 | Chang | |
| 2011/0019475 A1 | 1/2011 | Moshayedi | |
| 2011/0029716 A1 | 2/2011 | Moshayedi | |
| 2011/0038203 A1 | 2/2011 | Camp et al. | |
| 2011/0040926 A1 | 2/2011 | Frost et al. | |
| 2011/0060969 A1 | 3/2011 | Ramamoorthy et al. | |
| 2011/0072196 A1 | 3/2011 | Forhan et al. | |
| 2011/0167199 A1 | 7/2011 | Danilak | |
| 2011/0167319 A1 | 7/2011 | Jeddeloh | |
| 2011/0213920 A1 | 9/2011 | Frost et al. | |
| 2012/0072680 A1 | 3/2012 | Kimura et al. | |
| 2012/0089767 A1 | 4/2012 | Lee et al. | |
| 2012/0110417 A1 | 5/2012 | D'Abreu et al. | |
| 2012/0260146 A1 | 10/2012 | Lee et al. | |
| 2012/0311406 A1 | 12/2012 | Ratnam et al. | |
| 2013/0060565 A1 | 3/2013 | Nair et al. | |
| 2013/0073895 A1 | 3/2013 | Cohen | |
| 2013/0080862 A1 | 3/2013 | Bennett | |
| 2013/0151914 A1 | 6/2013 | Cadigan | |
| 2013/0173955 A1 | 7/2013 | Hallak et al. | |
| 2013/0179754 A1 | 7/2013 | Cherubini et al. | |
| 2013/0246891 A1 | 9/2013 | Manning et al. | |

FOREIGN PATENT DOCUMENTS

| | | |
|---|---|---|
| WO | WO 2004062113 | 7/2004 |
| WO | WO 2006070668 | 7/2006 |
| WO | WO 2007084751 | 7/2007 |
| WO | WO 2012047500 A1 | 4/2012 |
| WO | WO 2012075200 A2 | 6/2012 |

OTHER PUBLICATIONS

USPTO; Office Action dated Dec. 31, 2013, from related U.S. Appl. No. 13/477,598, filed May 22, 2012.

USPTO; Office Action dated Jan. 15, 2014, from related U.S. Appl. No. 13/477,568, filed May 22, 2012.

USPTO; Office Action dated Jan. 21, 2014, from related U.S. Appl. No. 13/477,633, filed May 22, 2012.

U.S. Appl. No. 13/477,600, filed May 22, 2012, Philip L. Northcott.
U.S. Appl. No. 13/477,633, filed May 22, 2012, Philip L. Northcott.
U.S. Appl. No. 13/477,629, filed May 22, 2012, Philip L. Northcott.
U.S. Appl. No. 13/477,598, filed May 22, 2012, Philip L. Northcott.
U.S. Appl. No. 13/477,595, filed May 22, 2012, Philip L. Northcott.
U.S. Appl. No. 13/477,568, filed May 22, 2012, Philip L. Northcott.
U.S. Appl. No. 13/477,599, filed May 22, 2012, Philip L. Northcott.
U.S. Appl. No. 13/477,845, filed May 22, 2012, Philip L. Northcott.
U.S. Appl. No. 13/477,635, filed May 22, 2012, Philip L. Northcott.
U.S. Appl. No. 13/477,601, filed May 22, 2012, Philip L. Northcott.

Daneshgaran, et al.; "An extensive search for good punctured rate-k/(k+1) recursive convolutional codes for serially concatenated convolutional codes," Information Theory, IEEE Transactions on, vol. 50, No. 1, pp. 208-217, Jan. 2004.

Frenger, et al.; "Rate-compatible convolutional codes for multirate DS-CDMS systems," Communications, IEEE Transactions on, vol. 47, No. 6, pp. 828-836, Jun. 1999.

Intel Corporation; Understanding the Flash Translation Layer (FTL) Specification, Application Note AP-684; retrieved from the Internet <URL: http://staff.ustc.edu.cn/~jpq/paper/flash/2006-Intel%20TR-Understanding%20the%20flash%20translation%20layer%20%28 FTL%29%20specification.pdf>; Dec. 1998; retrieved Jan. 26, 2012; Intel Corporation.

(56) References Cited

OTHER PUBLICATIONS

Jim Handy; Does MLC Flash Belong in Enterprise SSDs; retrieved from the Internet <URL: http://www.infostor.com/index/articles/display/3214572139/articles/infostor/volume-14/issue-1/special-report/does-mlc_flash_belong.html>; Feb. 1, 2010; retrieved on Jan. 24, 2012.

Ohtsuki, T.; "Rate adaptive indoor infrared wireless communication systems using repeated and punctured convolutional codes," Communications, 1999. ICC '99. 1999 IEEE International Conference on, vol. 1, No., pp. 609-613 vol. 1, 1999.

Sandforce; Product Brief SF-1500 Enterprise SSD Processors; retrieved from the Internet <URL: http://www.sandforce.com/userfiles/file/downloads/LSI_SandForce_1500ENT_PB_120104.pdf>; 2012; retrieved Jan. 24, 2012; LSI Corporation; Milpitas, CA.

Sandforce; Product Brief SF-2500 & SF-2600 Enterprise SSD Processors; retrieved from the Internet <URL: http://www.sandforce.com/userfiles/file/downloads/LSI_SandForce_2500-2600ENT_PB_120104.pdf>; 2012; retrieved on Jan. 24, 2012; LSI Corporation; Milpitas, CA.

Sandforce; RAISE Improves Total SSD Reliability; retrieved from the Internet <URL: http://sandforce.com/index.php?id=174&parentId=3>; 2012; retrieved on Jan. 24, 2012.

Sandforce; SandForce SSD Processors Transform Mainstream Data Storage; retrieved from the Internet <URL: http://www.sandforce.com/userfiles/file/downloads/SFI_Launch_PR_Final.pdf> Apr. 13, 2009; retrieved on Jan. 24, 2012; Saratoga, CA.

Zhou, et al.; "High rate turbo code using unevenly punctured convolutional constituent code," Communications, 1999. APCC/OECC '99. Fifth Asia-Pacific Conference on . . . and Fourth Optoelectronics and Communications Conference, vol. 1, No., pp. 751-754 vol. 1, 1999.

STEC; Engineering MLC Flash-Based SSDs to Reduce Total Cost of Ownership in Enterprise SSD Deployments; retrieved from the Internet <URL: http://www.stec-inc.com/downloads/whitepapers/SAFE_WP.pdf>; 2011; STEC, Inc.; retrieved on Jan. 24, 2012.

STEC; STEC Secure Array of Flash Elements Technology Improves Reliability of Enterprise-Class SSDs; retrieved from the Internet <URL: http://www.stec-inc.com/downloads/whitepapers/SAFE_WP.pdf>; 2011; STEC, Inc.; retrieved on Jan. 24, 2012.

USPTO; Office Action dated Jul. 24, 2013, from related U.S. Appl. No. 13/477,635, filed May 22, 2012.

USPTO; Office Action dated Feb. 14, 2014, from related application U.S. Appl. No. 13/477,595 (filed May 22, 2012).

USPTO; Office Action dated Feb. 28, 2014, from related application U.S. Appl. No. 13/477,599 (filed May 22, 2012).

USPTO; Office Action dated Mar. 4, 2014, from related application U.S. Appl. No. 13/477,845 (filed May 22, 2012).

USPTO; Office Action dated May 7, 2014, from related application U.S. Appl. No. 13/477,601 (filed May 22, 2012).

USPTO; Office Action dated May 27, 2014, from related application U.S. Appl. No. 13/477,629 (filed May 22, 2012).

USPTO; Office Action dated Jun. 5, 2014, from related application U.S. Appl. No. 13/477,598 (filed May 22, 2012).

USPTO; Office Action dated Jun. 9, 2014, from related application U.S. Appl. No. 13/477,845 (filed May 22, 2012).

USPTO; Office Action dated Jun. 20, 2014, from related application U.S. Appl. No. 13/477,595 (filed May 22, 2012).

USPTO; Office Action dated Jul. 16, 2014, from related application U.S. Appl. No. 13/477,600 (filed May 22, 2012).

USPTO; Office Action dated Jul. 31, 2014, from related application U.S. Appl. No. 13/477,568 (filed May 22, 2012).

USPTO; Office Action dated Aug. 1, 2014, from related application U.S. Appl. No. 13/477,633 (filed May 22, 2012).

USPTO; Office Action dated Aug. 27, 2014, from related application U.S. Appl. No. 13/844,448 (filed Mar. 15, 2013).

USPTO; Office Action dated Oct. 22, 2014, from related application U.S. Appl. No. 13/477,599 (filed May 22, 2012).

USPTO; Office Action dated Nov. 7, 2014, from related application U.S. Appl. No. 13/477,598 (filed May 22, 2012).

USPTO; Office Action dated Nov. 13, 2014, from related application U.S. Appl. No. 13/477,601 (filed May 22, 2012).

USPTO; Office Action dated Nov. 21, 2014, from related application U.S. Appl. No. 13/477,633 (filed May 22, 2012).

3rd Generation Partnership Project, Technical Report, Technical Specification Group Radio Access Network, UTRA High Speed Downlink Packet Access (Release 4), 3GPP TR 25.950 v4.0.1, Jul. 2005 [retrieved on Nov. 13, 2014]. Retrieved from the Internet: <URL: http://www.arib.or.jp/IMT-2000/V900Jul11/5_Appendix/Rel4/25/25950-401.pdf>.

Wikipedia, Asynchronous Transfer Mode, date unknown, [retrieved on Nov. 17, 2014]. Retrieved from the Internet: <URL:http://en.wikipedia.org/w/index.php?title=Asynchronous_Transfer_Mode&printable=yes>.

* cited by examiner

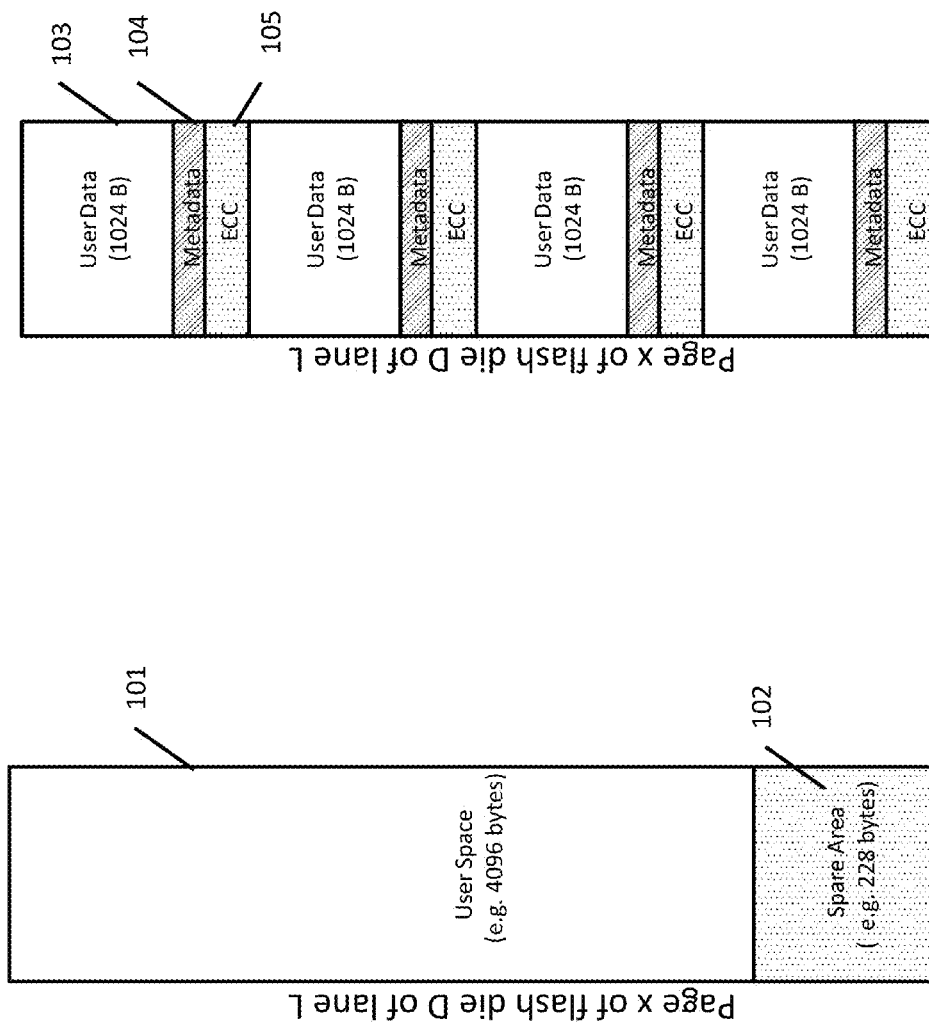

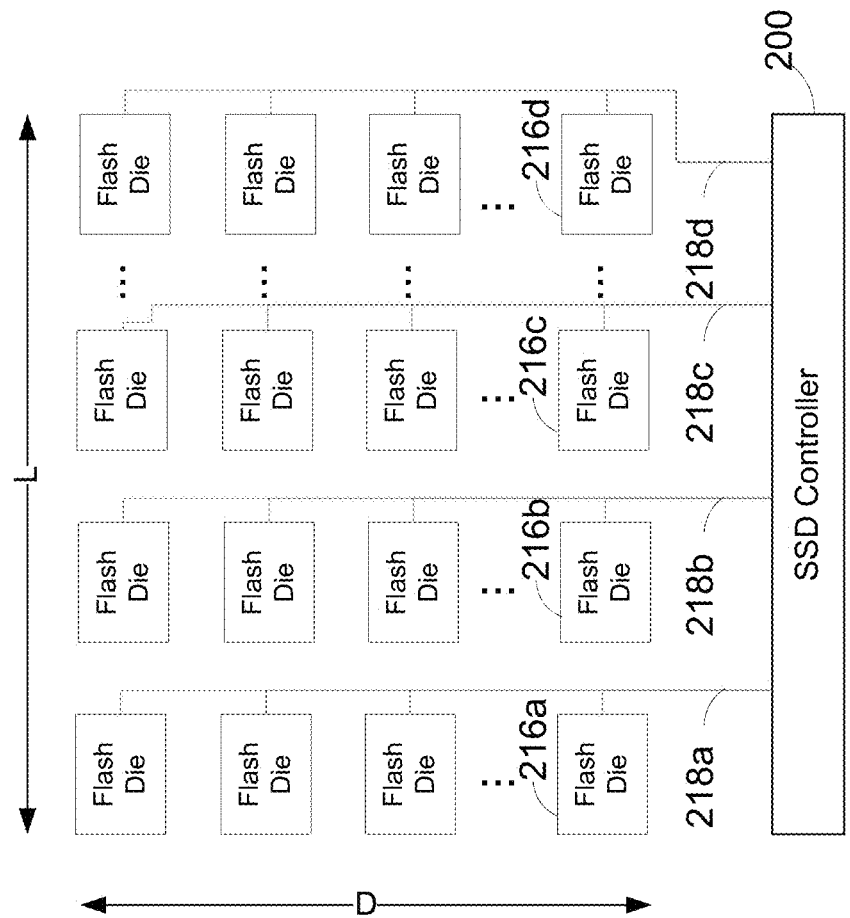

Page Grid Encoding Procedure

SYSTEMS AND METHODS FOR ADAPTING TO CHANGING CHARACTERISTICS OF MULTI-LEVEL CELLS IN SOLID-STATE MEMORY

CROSS-REFERENCE TO RELATED APPLICATION

Appendix A

This application is related to copending applications titled SYSTEMS AND METHODS FOR MAPPING FOR SOLID-STATE MEMORY, Ser. No. 13/844,448, SYSTEMS AND METHODS FOR STORING DATA FOR SOLID-STATE MEMORY, Ser. No. 13/844,463, SYSTEMS AND METHODS FOR DECODING DATA FOR SOLID-STATE MEMORY, Ser. No. 13/844,474, and SYSTEMS AND METHODS FOR RECLAIMING MEMORY FOR SOLID-STATE MEMORY, Ser. No. 13/844,486, filed on the same date as the present application, the disclosures of each of which are hereby incorporated by reference in their entirety herein.

Appendix B

This application is related to copending applications originally titled SYSTEMS AND METHODS FOR ADAPTIVELY SELECTING ERROR CORRECTION CODING SCHEMES IN A FLASH DRIVE, Ser. No. 13/477,600, SYSTEMS AND METHODS FOR INITIALIZING REGIONS OF A FLASH DRIVE HAVING DIVERSE ERROR CORRECTION CODING (ECC) SCHEMES, Ser. No. 13/477,633, SYSTEMS AND METHODS FOR ADAPTIVELY SELECTING AMONG DIFFERENT ERROR CORRECTION CODING SCHEMES IN A FLASH DRIVE, Ser. No. 13/477,629, SYSTEMS AND METHODS FOR REDUNDANTLY STORING ERROR CORRECTION CODES IN A FLASH DRIVE, Ser. No. 13/477,598, SYSTEMS AND METHODS FOR LOW LATENCY, HIGH RELIABILITY ERROR CORRECTION IN A FLASH DRIVE, Ser. No. 13/477,595, SYSTEMS AND METHODS FOR TRANSPARENTLY VARYING ERROR CORRECTION CODE STRENGTH IN A FLASH DRIVE, Ser. No. 13/477,568, SYSTEMS AND METHODS FOR TRANSPARENTLY VARYING ERROR CORRECTION CODE STRENGTH IN A FLASH DRIVE, Ser. No. 13/477,599, SYSTEMS AND METHODS FOR RECLAIMING FLASH BLOCKS OF A FLASH DRIVE, Ser. No. 13/477,845, SYSTEMS AND METHODS FOR REDUNDANTLY STORING DATA IN A FLASH DRIVE SUCH THAT A FAILED PAGE CAN BE TOLERATED, Ser. No. 13/477,635, and SYSTEMS AND METHODS FOR RECOVERING DATA FROM FAILED PORTIONS OF A FLASH DRIVE, Ser. No. 13/477,601, filed on the May 22, 2012, the disclosures of each of which are hereby incorporated by reference in their entirety herein.

BACKGROUND

1. Field of the Invention

Embodiments of the invention generally relate to electronics, and in particular, to memory controllers, such as to solid-state drive memory controllers.

2. Description of the Related Art

Flash memory is a form of non-volatile memory. A memory cell in flash memory can be a single-level cell (SLC), which encodes one bit of information per cell, or a multi-level cell (MLC), which encodes two or more bits of information per memory cell. Typically, a flash memory implementation using MLC is much cheaper than a flash memory implementation with SLC. Further, a flash memory device is arranged into pages and blocks. Data can be written to and read from flash memory in pages. A group of pages known as a block corresponds to the smallest erasable unit of flash memory.

Over time, programming and erasing flash memory causes a variety of defects that degrade the performance of the flash memory cell. In particular, MLC memory cells have much lower program/erase cycle lifetimes than SLC memory cells, which can be a problem in an enterprise application. This degradation, along with other noise effects, cause the signal-to-noise ratio of the memory cell to change over time. After the signal-to-noise ratio has fallen to a certain level, the flash memory device is typically no longer reliable. Manufacturers typically specify a number of program/erase cycles over which the properties of their flash devices are guaranteed.

As flash memory technologies become denser with decreasing process technology, the amount of charge stored on a floating gate of a memory cell tends to fall, crosstalk between cells tends to rise, insulation material between memory cells become thinner, and so on. Taken together, these effects tend to cause the signal-to-noise ratio of flash memory to decrease with each passing generation.

Flash memory devices require the use of a form of Error Correction Coding (ECC) to detect and correct the errors that inevitably occur. ECC, and in particular the ubiquitous Reed-Solomon or the Bose, Chaudhuri, and Hocquenghem (BCH) hard-decision codes, are widely used in electronics as a way of mitigating low signal-to-noise ratio in communications and storage media. With ECC, redundant information is stored or transmitted alongside the regular information bearing data, to permit an ECC decoder to deduce the originally transmitted or stored information even in the presence of errors.

A conventional approach to error management for MLC flash memories has been for the flash memory chip manufacturer to specify a particular strength of ECC code, typically a one-dimensional BCH code, capable of correcting a certain number of bits per certain size of sector, for example 24 bits per 1024 bytes. Examples of allocations of flash bytes in a typical flash page using vendor-specified BCH are shown in FIGS. 1A and 1B. FIG. 1A illustrates a standard layout for a page of flash memory. A region is provided for user data 101 or information data in the main area of the flash page, and a spare area 102 is provided to provide room for ECC parity and other data. In practice, the user data 103, metadata 104, such as data integrity feature (DIF) and Journaling Engine management data, and the manufacturer's recommended amount of ECC parity data 105 may be stored interleaved within the page as illustrated in FIG. 1B.

So long as the specified error correction is provided by the flash controller, the flash memory chip manufacturer guarantees a certain number of Program/Erase (P/E) cycles over which the flash memory chips will store and retain data, with no more errors than the ECC can correct, with a probability of uncorrectable errors occurring less than some acceptable risk for the end user. For example, consumer grade flash-based drives may tolerate a relatively high uncorrectable error rate. However, in an enterprise storage environment, a relatively low uncorrectable error rate is applicable, for example, $1 \times 10^{-16}$ (1E-16).

However, conventional approaches of applying ECC to flash memory can be inefficient at achieving relatively low uncorrectable error rates over the total service life and traffic loads that can be required in an enterprise storage environment, such as in a server.

SUMMARY

Disclosed techniques provide relatively low uncorrectable bit error rates for flash memory, low write amplification, long life, fast and efficient retrieval, and efficient storage density such that a solid-state drive (SSD), flash drive, or the like can be implemented using relatively inexpensive MLC flash or other MLC memory for an enterprise storage application.

One embodiment of the invention advantageously groups pages of memory across multiple dies, and manages these pages such that in a way that provides many benefits. For example, an embodiment of the invention provides for recovery of data after failure of a substantial part of a flash die, such as a page, block, plane, or entire die. Die failures after manufacturing test occur at a rate dependent on many factors, but rates of approximately 200 ppm are common. For an array of 256 dice, such as in an SSD, the likelihood of at least one such failure is $1-(1-200E-6)^{256}=5\%$. One embodiment of the invention reduces the impact of error floors and flares in an inner (primary) ECC schemes such as BCH or LDPC to acceptable levels, said acceptable level being application-dependent, with 1 uncorrectable error in 1E16 bits being typical. One embodiment of the invention allows operation of that primary ECC in error regimes that, on their own, can produce unacceptably high post-correction error. One embodiment of the invention reduces or minimizes impacts to overprovisioning, throughput, power, and endurance arising from the failure of one or more dies (or partial dies) in a flash array. One embodiment of the invention allows for fine-grained setting of the initial over-provisioning at the beginning of life of a drive.

The methods described herein help make SSDs using MLC flash less expensive, more reliable, and easier to manage. For example, it makes possible the construction of robust SSDs that can continue operation seamlessly despite the failure of multiple dies in the field, with virtually no decrease in reliability. This can be an important feature in a number of applications, including, but not limited to, industrial, military, and mobile networking applications. One embodiment effectively moves the block remapping function into the error correction domain and eliminates the tables used to avoid bad blocks, saving approximately 1 MB of DRAM per 2 GB of Flash.

One embodiment includes an electronically-implemented method of organizing memory for a mass-storage device for redundancy, wherein the method includes: organizing the memory into a plurality of block grids, wherein a block grid includes a plurality of page grids, wherein a page grid includes a plurality of page stripes, wherein a page stripe includes a plurality of pages or integer fractions thereof; distributing a first plurality of N journaling cell slots among the page stripes of a first page grid, wherein a journaling cell slot includes an area of memory large enough to store a journaling cell; wherein the N journaling cell slots further includes N1 journaling cell slots for user data and N2 journaling cell slots for grid parity data, wherein both N1 and N2 are integers, wherein the page stripes of the first page grid include at least a first page stripe associated with a first gear such that the first page stripe has a first non-zero integer journaling cell slot capacity for data and a first capacity for parity bits of a first error correction code protective of data stored within the first page stripe, a second page stripe associated with a second gear such that the second page stripe has a second non-zero integer journaling cell slot capacity different from the first non-zero journaling slot capacity and a second capacity for parity bits of the first error correction code protective of data stored within the second page stripe, at least a third page stripe associated with a gear zero such that the third page stripe has a zero journaling cell slot capacity and has no parity bits; wherein grid parity data includes a set of parity bits of a second error correction code protective over the first page grid, wherein the second error correction code is of an erasure code type such that decoding of the grid parity data can rebuild data of at least one failed page stripe of the first page grid; and mapping a logical block address to a journaling packet, which is mapped to one or more journaling cell slots of the N1 journaling cell slots.

One embodiment includes an electronically-implemented method of mapping memory for a mass-storage device, wherein the method includes: grouping flash pages into page grids, wherein pages of a page grid have the same block and page address, wherein the page grid spans one or more planes and 3 or more dice; subgrouping the page grid into page stripes, wherein a page stripe of the page grid includes at least two pages from different planes of a first die; adaptively selecting a data storage capacity of the page stripe corresponding to an integer multiple of journaling cell slots and a characteristic of a first error correction code stored within the page stripe, wherein the first error correction code is protective of data and stored within the page stripe, wherein a journaling cell slot includes an area of memory large enough to store a journaling cell; and reserving a pre-determined number of journaling cell slots of the page grid for storage of a second error correction code protective of data stored within journaling cell slots and the corresponding first error correction code across the page grid.

One embodiment includes an apparatus for organizing memory for a mass-storage device for redundancy, wherein the apparatus includes: an ECC encoder/decoder; and a circuit configured to: organize the memory into a plurality of block grids, wherein a block grid includes a plurality of page grids, wherein a page grid includes a plurality of page stripes, wherein a page stripe includes a plurality of pages or integer fractions thereof; distribute a first plurality of N journaling cell slots among the page stripes of a first page grid, wherein a journaling cell slot includes an area of memory large enough to store a journaling cell; wherein the N journaling cell slots further include N1 journaling cell slots for user data and N2 journaling cell slots for grid parity data, wherein both N1 and N2 are integers, wherein the page stripes of the first page grid include at least a first page stripe associated with a first gear such that the first page stripe has a first non-zero integer journaling cell slot capacity for data and a first capacity for parity bits of a first error correction code protective of data stored within the first page stripe, a second page stripe associated with a second gear such that the second page stripe has a second non-zero integer journaling cell slot capacity different from the first non-zero journaling slot capacity and a second capacity for parity bits of the first error correction code protective of data stored within the second page stripe, at least a third page stripe associated with a gear zero such that the third page stripe has a zero journaling cell slot capacity and has no parity bits; wherein grid parity data includes a set of parity bits of a second error correction code protective over the first page grid, wherein the second error correction code is of an erasure code type such that decoding of the grid parity data can rebuild data of at least one failed page stripe of the first page grid; wherein the circuit is configured to map a logical block address to a journaling packet, which is mapped to one or more journaling cell slots of the N1 journaling cell slots.

One embodiment includes an apparatus for mapping memory for a mass-storage device, wherein the apparatus includes: an ECC encoder/decoder; and a management processor configured to: group flash pages into page grids, wherein pages of a page grid have the same block and page address, wherein the page grid spans one or more planes and 3 or more dice; subgroup the page grid into page stripes, wherein a page stripe of the page grid includes at least two pages from different planes of a first die; adaptively select a data storage capacity of the page stripe corresponding to an integer multiple of journaling cell slots and a characteristic of a first error correction code stored within the page stripe, wherein the first error correction code is protective of data and stored within the page stripe, wherein a journaling cell slot includes an area of memory large enough to store a journaling cell; and reserve a pre-determined number of journaling cell slots of the page grid for storage of a second error correction code protective of data stored within journaling cell slots and the corresponding first error correction code across the page grid.

One embodiment includes an electronically-implemented method of data storage, wherein the method includes: determining a page stripe to be programmed; receiving user data as logical blocks associated with logical block addresses to be stored in a mass-storage device, wherein the mass-storage device includes a plurality of memory dies arranged in an array of one or more lanes in width and two or more dies in depth, wherein the memory dies include non-volatile memory, wherein the mass-storage device is organized into a plurality of block grids, wherein a block grid includes a plurality of page grids, wherein a page grid includes a plurality of page stripes, wherein a page stripe includes a plurality of pages or integer fractions thereof; arranging each logical block of user data into a journaling packet such that the journaling packet holds journaling packet data; arranging the journaling packet data into one or more journaling cells for writing to the mass-storage device, wherein page stripes have allocated therein, zero or more slots for storage of journaling cells; when there are at least as many journaling cells with journaling packet data ready to be written as there are journaling cell slots for journaling packet data in the page stripe: allocating the journaling packet data of each journaling cell to information bits of one or more primary error correction code (ECC) codewords; calculating primary parity for the primary ECC codewords for each journaling cell in the page stripe, wherein the primary parity is protective of journaling packet data to be stored within the journaling cell slots of the page stripe; programming the page stripe with the journaling cells; updating a first mapping table to associate at least one or more logical addresses of the user data with one or more physical addresses for corresponding journaling cell slots; and selecting a next page stripe to be programmed, wherein the page stripes of the page grid are programmed in a predetermined order, wherein in selecting the next page stripe, any page stripes that have a zero journaling cell slot allocation are skipped until one is found that has a non-zero journaling cell slot allocation.

One embodiment includes an apparatus, wherein the apparatus includes: an ECC encoder/decoder; and a first circuit configured to: determine a page stripe to be programmed; receive user data as logical blocks associated with logical block addresses to be stored in a mass-storage device, wherein the mass-storage device includes a plurality of memory dies arranged in an array of one or more lanes in width and two or more dies in depth, wherein the memory dies include non-volatile memory, wherein the mass-storage device is organized into a plurality of block grids, wherein a block grid includes a plurality of page grids, wherein a page grid includes a plurality of page stripes, wherein a page stripe includes a plurality of pages or integer fractions thereof; arrange each logical block of user data into a journaling packet such that the journaling packet holds journaling packet data; arrange the journaling packet data into one or more journaling cells for writing to the mass-storage device, wherein page stripes have allocated therein, zero or more slots for storage of journaling cells; when there are at least as many journaling cells with journaling packet data ready to be written as there are journaling cell slots for journaling packet data in the page stripe: the first circuit is configured to allocate the journaling packet data of each journaling cell to information bits of one or more primary error correction code (ECC) codewords; the ECC encoder/decoder is configured to calculate primary parity for the primary ECC codewords for each journaling cell in the page stripe, wherein the primary parity is protective of journaling packet data to be stored within the journaling cell slots of the page stripe; the first circuit is configured to program the page stripe with the journaling cells; the first circuit is configured to update a first mapping table to associate at least one or more logical addresses of the user data with one or more physical addresses for corresponding journaling cell slots; and the first circuit is configured to select a next page stripe to be programmed, wherein the page stripes of the page grid are programmed in a predetermined order, wherein in selecting the next page stripe, any page stripes that have a zero journaling cell slot allocation are skipped until one is found that has a non-zero journaling cell slot allocation.

One embodiment includes an electronically-implemented method of retrieving user data, wherein the method includes: receiving a logical address and a read request for the user data; determining a journaling cell slot, a first page stripe, and a page grid corresponding to the logical address, wherein the page grid includes a plurality of related page stripes including the first page stripe, wherein the page stripes of the page grid are related by having a grid error correction code having codewords spanning the page grid, wherein the page stripe includes a plurality of pages or integer fractions thereof, wherein the journaling cell slot is allocated to the first page stripe; retrieving information indicative of a capacity of journaling cell slots per page stripe of the page grid, wherein the capacity is zero for at least a second page stripe of the page grid; identifying data corresponding to the at least second page stripe as identically zero for a decoder of the grid error correction code; retrieving data from a set of page stripes of the page grid having non-zero journaling cell slot capacity, wherein page stripes having non-zero journaling cell slot capacity each have a primary error correction code within the page stripe; performing error correction within the page stripes of the page grid having non-zero journaling cell slot capacity; decoding the grid error correction code to correct errors throughout the page grid to generate a first corrected first page stripe; performing primary error correction on the first corrected first page stripe to generate a second corrected first page stripe; and providing the user data from the journaling cell slot of the second corrected first page stripe.

One embodiment includes an apparatus for retrieving user data, wherein the apparatus includes: a circuit configured to: receive a logical address and a read request for the user data; determine a journaling cell slot, a first page stripe, and a page grid corresponding to the logical address, wherein the page grid includes a plurality of related page stripes including the first page stripe, wherein the page stripes of the page grid are related by having a grid error correction code having codewords spanning the page grid, wherein the page stripe includes a plurality of pages or integer fractions thereof, wherein the journaling cell slot is allocated to the first page stripe; retrieve information indicative of a capacity of journaling cell slots per page stripe of the page grid, wherein the capacity is zero for at least a second page stripe of the page grid; identify data corresponding to the at least second page stripe as identically zero for a decoder of the grid error correction code; retrieve data from a set of page stripes of the page grid having non-zero journaling cell slot capacity, wherein page stripes having non-zero journaling cell slot capacity each have a primary error correction code within the page stripe; and an ECC encoder/decoder configured to: perform error correction within the page stripes of the page grid having non-zero journaling cell slot capacity; decode the grid error correction code to correct errors throughout the page grid to generate a first corrected first page stripe; perform primary error correction on the first corrected first page stripe to generate a second corrected first page stripe; and provide the user data from the journaling cell slot of the second corrected first page stripe.

One embodiment includes an electronically-implemented method of reclaiming a flash block of a flash array, wherein the method includes: selecting a block grid for reclamation, wherein block grids include a plurality of page grids, wherein page grids include a plurality of page stripes, wherein page stripes include a plurality of pages or integer fractions thereof, wherein a block of pages includes a smallest eraseable unit of memory such that the plurality of page grids comprising a block grid are related by having pages belonging to the same blocks; wherein a host accesses data using logical block addresses, wherein the logical blocks are stored in journaling cell slots, wherein valid data includes data stored in journaling cell slots that the host expects to be able to access; wherein a plurality of gears indicative of a journaling cell capacity and error correction coding scheme include at least a first gear, a second gear, and a gear zero, wherein page stripes associated with the first gear have a first non-zero integer journaling cell slot capacity and a first error correction coding scheme protective of data stored in the journaling cells of the first page stripe, wherein page stripes associated with the second gear have a second non-zero integer journaling cell slot capacity different from the first non-zero journaling slot capacity and a second error correction coding scheme protective of data stored in the journaling cells of the second page stripe, wherein page stripes associated with gear zero have a zero journaling cell slot capacity and no parity bits of the second error correction code; wherein for valid data stored in the block grid, the method further includes: reading data from corresponding one or more journaling cell slots; performing error correction on the read data to generate corrected data; evaluating a condition of a page stripe based at least partly on the error correction decoding of the data within the journaling cell slots of the page stripe; storing the corrected data into one or more journaling cell slots of page stripes of a different block grid; updating one or more tables with new associations between logical block addresses and journaling cell slots; erasing the blocks of the block grid; updating gear settings for the page stripes of the block grid based at least partly on the evaluation conditions for the page stripes; and making the page stripes of the block grid available for writing; wherein at least selecting, reading, and storing are performed by an integrated circuit.

One embodiment includes an apparatus for reclaiming a flash block of a flash array, wherein the apparatus includes: a first circuit configured to select a block grid for reclamation, wherein block grids include a plurality of page grids, wherein page grids include a plurality of page stripes, wherein page stripes include a plurality of pages or integer fractions thereof, wherein a block of pages includes a smallest eraseable unit of memory such that the plurality of page grids comprising a block grid are related by having pages belonging to the same blocks; wherein a host accesses data using logical block addresses, wherein the logical blocks are stored in journaling cell slots, wherein valid data includes data stored in journaling cell slots that the host expects to be able to access; wherein a plurality of gears indicative of a journaling cell capacity and error correction coding scheme include at least a first gear, a second gear, and a gear zero, wherein page stripes associated with the first gear have a first non-zero integer journaling cell slot capacity and a first error correction coding scheme protective of data stored in the journaling cells of the first page stripe, wherein page stripes associated with the second gear have a second non-zero integer journaling cell slot capacity different from the first non-zero journaling slot capacity and a second error correction coding scheme protective of data stored in the journaling cells of the second page stripe, wherein page stripes associated with gear zero have a zero journaling cell slot capacity and no parity bits of the second error correction code; a second circuit including an ECC encoder/decoder, wherein the second circuit is configured to, when valid data stored in the block grid: read data from corresponding one or more journaling cell slots; perform error correction on the read data to generate corrected data; evaluate a condition of a page stripe based at least partly on the error correction decoding of the data within the journaling cell slots of the page stripe; store the corrected data into one or more journaling cell slots of page stripes of a different block grid; update one or more tables with new associations between logical block addresses and journaling cell slots; erase the blocks of the block grid; update gear settings for the page stripes of the block grid based at least partly on the evaluation conditions for the page stripes; and make the page stripes of the block grid available for writing.

One embodiment includes an electronically-implemented method of adapting to changing characteristics of multi-level flash cells, the method comprising: storing data in pages of a memory device having multi-level cells, wherein two or more bonded pages share a set of multi-level cells, wherein a multi-level cell is configured to store a first bit for a first page and a second bit for a second page of the bonded pages; arranging the pages of the memory device into a plurality of page stripes for storage of data, wherein page stripes individually include one or more pages or integer fractions thereof, wherein the bonded pages belong to separate page stripes such that a first page stripe and a second page stripe of a bonded page stripe are related by having bonded pages of memory that share multi-level cells, wherein an ECC characteristic is selected for a page stripe and is applicable to the one or more pages or integer fractions thereof of the page stripe, wherein the plurality of page stripes include at least a third page stripe associated with a first gear such that the third page stripe has a first non-zero integer journaling cell slot capacity for data and a first capacity for parity bits of a first error correction code protective of data stored within the first page stripe and a fourth page stripe associated with a second gear such that the fourth page stripe has a second non-zero integer journaling cell slot capacity different from the first non-zero journaling slot capacity and a second capacity for parity bits of the first error correction code protective of data stored within the second page stripe; using the first page stripe and the second page stripe of the bonded page stripe to store data; determining a first estimated bit error rate (first BER) for the first page stripe and a second estimated bit error rate (second BER) for the second page stripe during field use of the memory device, wherein none of the first page stripe or the second page stripe is associated with gear zero at the time of determining the first BER and the second BER, wherein gear zero corresponds to a zero journaling cell slot capacity; and when at least one of the first BER or the second BER exceeds a first predetermined threshold, associating gear zero with a selected one of the first page stripe or the second page stripe.

One embodiment includes an electronically-implemented method of selecting an error correction code (ECC) characteristic, wherein the method includes: storing data in pages of a memory device having multi-level cells, wherein two or more bonded pages share a set of physical cells, wherein a multi-level cell is configured to store a first bit for a first page, a second bit for a second page, and a third bit for a third page of the bonded pages; arranging the pages of the memory device into a plurality of page stripes for storage of data, wherein page stripes individually include one or more pages or integer fractions thereof, wherein the bonded pages belong to separate page stripes such that a first page stripe, a second page stripe, and a third page stripe of a bonded page stripe are related by having bonded pages of memory that share multi-level cells, wherein an ECC characteristic is selected for a page stripe and is applicable to the pages of the page stripe, wherein the plurality of page stripes include at least a fourth page stripe associated with a first gear such that the fourth page stripe has a first non-zero integer journaling cell slot capacity for data and a first capacity for parity bits of a first error correction code protective of data stored within the first page stripe, and a fifth page stripe associated with a second gear such that the second page stripe has a second non-zero integer journaling cell slot capacity different from the first non-zero journaling slot capacity and a second capacity for parity bits of the first error correction code protective of data stored within the second page stripe; using the first page stripe, the second page stripe, and the third page stripe of the bonded page stripe to store data; determining a first estimated bit error rate (first BER) for the first page stripe, a second estimated bit error rate (second BER) for the second page stripe, and a third estimated bit error rate (third BER) for the third page stripe during field use of the memory device, wherein none of the first page stripe, the second page stripe, or the third page stripe is associated with gear zero at the time of determining the first BER, the second BER, and the third BER, wherein gear zero corresponds to a zero journaling cell slot capacity; and when at least one of the first BER, the second BER, or the third BER exceeds a first predetermined threshold, associating gear zero with a selected one of the first page stripe, the second page stripe, or the third page stripe.

One embodiment includes an apparatus, wherein the apparatus includes: a journaling engine configured to: store data in pages of a memory device having multi-level cells, wherein two or more bonded pages share a set of multi-level cells, wherein a multi-level cell is configured to store a first bit for a first page and a second bit for a second page of the bonded pages; arrange the pages of the memory device into a plurality of page stripes for storage of data, wherein page stripes individually include one or more pages or integer fractions thereof, wherein the bonded pages belong to separate page stripes such that a first page stripe and a second page stripe of a bonded page stripe are related by having bonded pages of memory that share multi-level cells, wherein an error correction code (ECC) characteristic is selected for a page stripe and is applicable to the one or more pages or integer fractions thereof of the page stripe, wherein the plurality of page stripes include at least a third page stripe associated with a first gear such that the third page stripe has a first non-zero integer journaling cell slot capacity for data and a first capacity for parity bits of a first error correction code protective of data stored within the first page stripe and a fourth page stripe associated with a second gear such that the fourth page stripe has a second non-zero integer journaling cell slot capacity different from the first non-zero journaling slot capacity and a second capacity for parity bits of the first error correction code protective of data stored within the second page stripe; use the first page stripe and the second page stripe of the bonded page stripe to store data; and an ECC encoder/decoder configured to: determine a first estimated bit error rate (first BER) for the first page stripe and a second estimated bit error rate (second BER) for the second page stripe during field use of the memory device, wherein none of the first page stripe or the second page stripe is associated with gear zero at the time of determining the first BER and the second BER, wherein gear zero corresponds to a zero journaling cell slot capacity; and when at least one of the first BER or the second BER exceeds a first predetermined threshold, associate gear zero with a selected one of the first page stripe or the second page stripe.

One embodiment includes an apparatus, wherein the apparatus includes: a journaling engine configured to: store data in pages of a memory device having multi-level cells, wherein two or more bonded pages share a set of physical cells, wherein a multi-level cell is configured to store a first bit for a first page, a second bit for a second page, and a third bit for a third page of the bonded pages; arrange the pages of the memory device into a plurality of page stripes for storage of data, wherein page stripes individually include one or more pages or integer fractions thereof, wherein the bonded pages belong to separate page stripes such that a first page stripe, a second page stripe, and a third page stripe of a bonded page stripe are related by having bonded pages of memory that share multi-level cells, wherein an error correction code (ECC) characteristic is selected for a page stripe and is applicable to the pages of the page stripe, wherein the plurality of page stripes include at least a fourth page stripe associated with a first gear such that the fourth page stripe has a first non-zero integer journaling cell slot capacity for data and a first capacity for parity bits of a first error correction code protective of data stored within the first page stripe, and a fifth page stripe associated with a second gear such that the second page stripe has a second non-zero integer journaling cell slot capacity different from the first non-zero journaling slot capacity and a second capacity for parity bits of the first error correction code protective of data stored within the second page stripe; use the first page stripe, the second page stripe, and the third page stripe of the bonded page stripe to store data; a first circuit configured to determine a first estimated bit error rate (first BER) for the first page stripe, a second estimated bit error rate (second BER) for the second page stripe, and a third estimated bit error rate (third BER) for the third page stripe during field use of the memory device, wherein none of the first page stripe, the second page stripe, or the third page stripe is associated with gear zero at the time of determining the first BER, the second BER, and the third BER, wherein gear zero corresponds to a zero journaling cell slot capacity; and a second circuit configured to associate gear zero with a selected one of the first page stripe, the second page stripe, or the third page stripe when at least one of the first BER, the second BER, or the third BER exceeds a first predetermined threshold.

BRIEF DESCRIPTION OF THE DRAWINGS

These drawings and the associated description herein are provided to illustrate specific embodiments of the invention and are not intended to be limiting.

FIGS. 1A and 1B illustrate a conventional flash page arrangement.

FIG. 2B illustrates an embodiment of a flash array.

In this description, reference is made to the drawings in which like reference numerals may indicate identical or functionally similar elements.

DETAILED DESCRIPTION OF SPECIFIC EMBODIMENTS

Figure 2A:
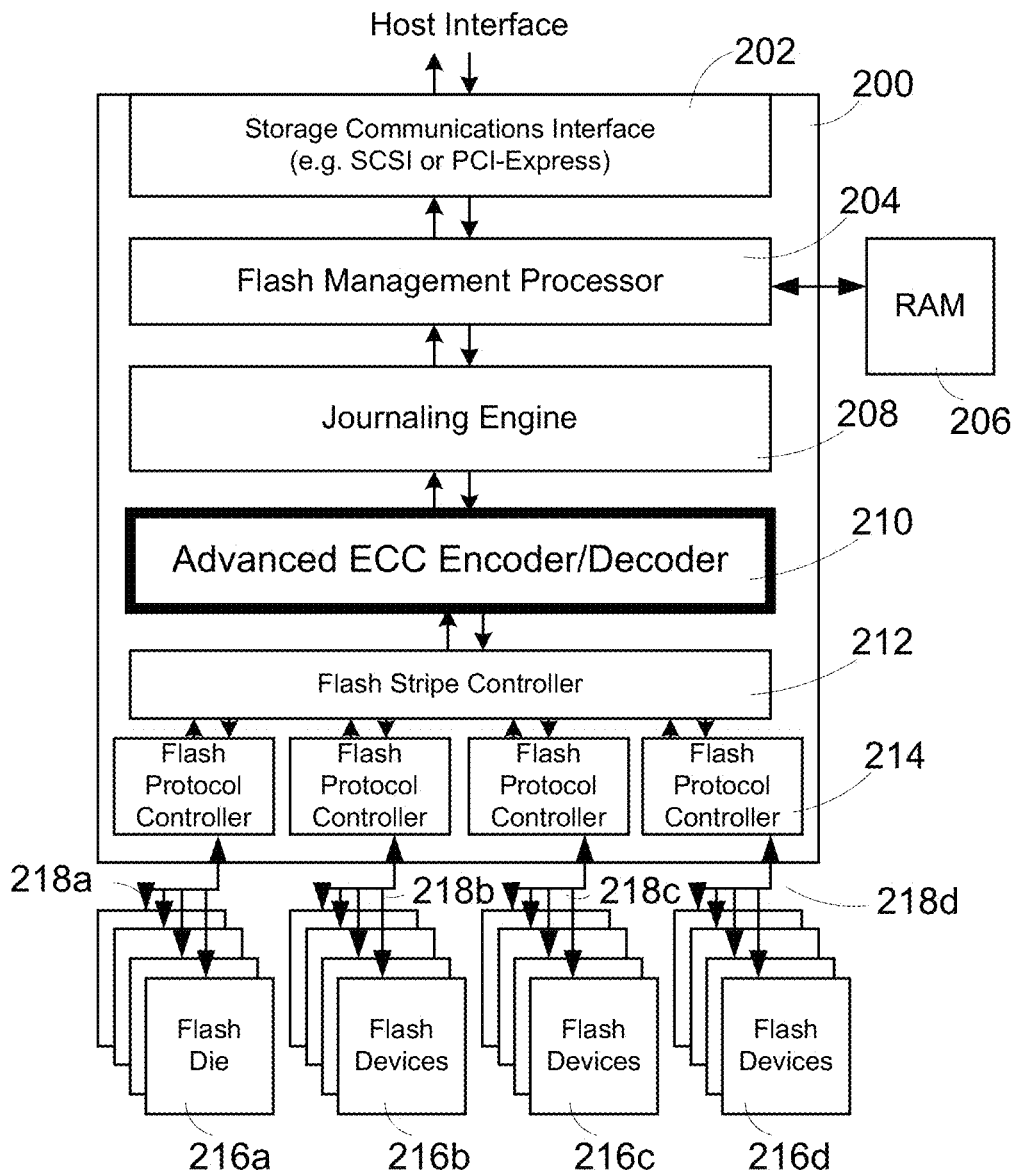
FIG. 2A illustrates an example of a block diagram for a solid-state drive controller according to an embodiment of the invention.

Although particular embodiments are described herein, other embodiments of the invention, including embodiments that do not provide all of the benefits and features set forth herein, will be apparent to those of ordinary skill in the art. For example, while illustrated in the context of multi-level flash memory cells, the principles and advantages described herein are applicable to other types of memory cells, such as single-level flash memory cells, phase-change memory (PCM) cells, memristor, spin-torque magnetic memory, 3-dimensional NAND flash, and the like.

The techniques disclosed herein can be performed by hardware, by firmware/software, or by a combination of hardware and firmware/software. These techniques can be implemented by execution of software modules by a computer hardware system. Instructions for the software can be stored in a tangible, non-transitory, computer-readable medium and executed by a processor. At least a portion of hardware can be implemented using a design based on a very high description language (VHDL).

Definitions and Example

The following definitions and examples may be helpful in understanding the specification. The examples are not intended to be limiting.

xEy: x times 10 raised to the y-th power, that is $x(10^y)$. Thus 2.1E6 is 2,100,000, and 5E-3 is 0.005.

RBER: Raw Bit Error Rate. RBER refers to the number of differences (errors) between the data written to a region of flash, and the data read from the flash, divided by the total number of bits in that region.

UBER: Uncorrected Bit Error Rate. This refers to the number of differences (errors) between a set of data blocks sent to a flash file system, and the contents of those data blocks when read back from the flash file system, divided by the total number of bits in the data block(s).

ECC: Error Correction Coding is a class of techniques in which redundant information (parity) is added to information (information bits) in such a way that if errors are subsequently introduced, the original information bits can be recovered. ECC can also stand for error correction code, corresponding to the parity symbols themselves. An ECC has a correction capability, which represents its ability to correct errors. In the simplest form, this may be a certain number of bits T per ECC codeword length N, but in complex codes the correction capability can be hard to represent succinctly, and is often expressed in statistical terms, such as the RBER (for random errors) that can be reduced to a desired UBER.

Metadata: Information stored by the file system for the purpose of managing the storage and retrieval of user information from the storage array. This information may include the mapping of user allocation blocks to physical locations, as well as information about the flash array itself. Metadata is a broad term to describe information that is stored in flash, but is not user data, ECC parity, or unused space.

Codeword: a set of K information symbols, plus P parity symbols calculated from the information symbols by a predetermined formula. In the case of BCH or LDPC codes, a symbol is 1 bit; in the case of RS codes it is m bits, where m is the order of the code. The information bits can correspond to a portion of user data stored in a journaling cell or to metadata, which will be considered user data herein. However, for extra redundancy, a portion of the parity of an earlier-in-time ECC code, such as the primary ECC can be part of the "information bits" for a subsequent ECC, such as a grid parity. The information block and the parity ECC of a codeword do not need to be stored adjacent to one another.

Page Stripe: A grouping of one or more equally-sized flash pages (or integer fractions of pages, such as ½ a page) which can be read more-or-less simultaneously, and which can be managed as a single region for the purpose of journaling. A page stripe has one gear setting at any given time, which is applied to all pages of the page stripe, and has a payload capacity which is an integer number of journaling cells. A page stripe should be made up of pages on different flash planes or, possibly, different dies. For both latency and reliability purposes, it is preferable to use pages residing on different dice and attached to different data buses, but from a power perspective it is better to use pages residing on different planes of the same die. In one embodiment, a page stripe comprises four pages on different planes of the same flash die, each page comprising 8192+512 bytes such that a size of the page stripe of this example is 34,816 bytes, which is allocated among journaling cell slots and primary parity for the data stored within the journaling cell slots. In another embodiment, a page stripe comprises four pages, two residing on different planes of a first die, and two residing on different planes of a second die, each page comprising 8192+448 bytes. In another embodiment, a page stripe comprises a single page of 4380 bytes. The size of a page stripe is not limited to any particular size.

Page Grid: A grouping of associated page stripes (or pages when page stripes are not used), wherein grid error protection exists to protect the pages of the page grid. The grid error correction is preferably an erasure code such as Reed Solomon (RS) or Low-Density Parity-Check (LDPC), capable of rebuilding data lost when a page of the page grid becomes unreadable. In one embodiment, a Page Grid comprises 32 page stripes, each residing on a different flash die.

Block Stripe: A set of flash blocks from one or more dies in a flash array that contains a set of complete page stripes.

Block Grid: A set of flash blocks from one or more dies in a flash array that contains a set of complete page grids.

Flash die: A monolithic piece of semiconductor material containing flash memory and control circuitry. A flash package typically contains between one and eight flash dies. Flash dies are often referred to as logical units (LUNs).

Gear: In the context of this disclosure, a "gear" or "ECC characteristic" is a set of parameters specifying an error correction coding scheme, including one or more of the payload capacity, the type and parameters of each component code, the interleaving scheme, and parameters used for determining whether the gear is appropriate for a particular situation.

Block: Depending on context, a "block" can refer to: the smallest erasable unit within a flash memory ('flash block'), can refer to an amount of data over which an error correction code is calculated ('block code'), can refer to a block within a flowchart or process, or can refer to an addressable unit of input/output ('SCSI block') corresponding to a particular virtual address or logical block address ('LBA') of a data storage device, such as a hard disk, which is emulated by a solid-state drive or a flash drive. It will be apparent to one of ordinary skill in the art which is intended based on context.

Journaling Cell: The minimum unit of data for which the journaling engine or flash translation layer makes reads from or writes to the storage media. In one embodiment, a journaling cell is 2120 bytes, comprising 2048 user data bytes, 32 bytes of data integrity field (DIF), 32 bytes of data integrity extension (DIX), and 8 bytes of journaling engine metadata. In one embodiment, the size of the journaling cell is fixed for a given region of the storage media after initialization of that media. In another embodiment, requiring more complex implementation, the size of the journaling cell is fixed for each logical storage volume, but may vary within page stripes shared between logical volumes, in which case the number of parity bits in each codeword adjusts to accommodate the differing journaling cell size.

High confidence: the probability of the opposite result is less than a predetermined acceptable error probability, such as, but not limited to, 1E-15, 1E-16, and the like.

Journaling cell slot: A memory space within a page stripe allocated to the storage of a journaling cell.

Journaling Packet: The minimum unit of data for which the journaling engine or flash translation layer has a logical-to-physical mapping. A journaling packet is associated with a particular logical address, such as a logical block address (LBA), and stored within one or more consecutive journaling cell slots within a page grid. In one embodiment, a journaling packet holds a complete SCSI block or logical allocation block and associated metadata. In one embodiment, a journaling packet and logical allocation block are each of 4240 bytes and is stored in two journaling cell slots. For example, the 4240 bytes can include 4096 bytes or normal data and 144 bytes of metadata. In alternative embodiments, when the journaling cell slots and logical allocation blocks are the same size, then a journaling cell can be equivalent to a journaling packet.

Bonded pages: Pages that share multi-level memory cells.

Bonded page stripes: Page stripes that share multi-level memory cells.

MOD: the modulo operator under modular arithmetic, denoting the remainder when the left operand is divided by the right operand. Thus 32 MOD 10=2.

DIV: the integer divide operation, calculated by dividing the left operand by the right operand, and rounding down to the nearest integer. Thus 32 DIV 10=3.

Journaling File Systems or Flash Translation Layer

Flash memory based storage systems can suffer from write amplification. In flash memory, the minimum erasable block size, typically 1 MB or more, is much larger than on hard disks using platters. A file system, which is typically part of an operating system of a host, exchanges data with a data storage device in different kinds of blocks, which should not be confused with storage blocks or erase blocks, which correspond to the minimum erasable unit in a flash device. Data is transferred to and from a host and a block device, such as a hard disk drive or other storage device, in units of data termed allocation blocks herein. An allocation block is also known as a logical block. These allocation blocks can correspond to "disk sectors" in a hard disk drive. Each of these allocation blocks has a virtual address. A flash translation layer is used so that a flash drive can emulate a hard disk drive by transferring data to and from the host in allocation blocks as expected by the file system. An example of a flash translation layer is described in U.S. Pat. No. 5,404,485 to Amir Ban, the disclosure of which is incorporated by reference in its entirety herein.

An allocation block is a sequence of words, such as bits or bytes or multiples thereof, of a certain block size, and is the minimum unit of data that is transferred to or from a host and a data storage device, such as a flash drive or a hard disk drive. While the allocation block size can vary among data storage devices, the allocation block size is always fixed for a particular data storage device. Examples of an allocation block size that have been used in the past include 512, 520, 528, 4096, and 4224 bytes. In one embodiment, the allocation block size is 4240 bytes. However, other allocation block sizes are possible. The data storage device can communicate its allocation block size and number of available allocation blocks to the host in response to low-level commands from the host.

The number of address bits can vary in a very wide range. For example, the ATA-1 standard has 28-bit addresses and the ATA-6 standard has 48-bit addresses. Typically, an interface standard requires that the virtual address start at 0 and be contiguous up to the last allocation block available on the drive.

To modify a piece of data in flash memory, an entire storage block of the flash memory containing the data is read, the entire storage block erased, and then some or all of the data can be modified and written back. If the flash memory is mapped into a conventional file system without a flash translation layer, in which the physical address of data on the flash memory is determined by the apparent address or logical block address in the user file system, this disadvantage can lead to relatively large amounts of reading or writing when files are being altered, which slows down write operations. Other problems also arise. For instance, if a few files are regularly updated, one part of the flash memory may wear out long before others. Even when wear leveling is utilized, such erase and programming operations can drastically shorten the life of a solid-state drive or flash drive.

Write amplification describes a ratio between user data written, for example, one 512 byte disk sector, and the total amount of data that is actually written to the flash memory. For example, when an entire block, for example, 256 pages of 8 sectors each, is rewritten to alter one sector, then the write amplification is 2048. Block sizes and write amplification can vary from the example shown. However, this very large value for write amplification means that writes to the SSD will take a relatively long time, and due to the write amplification, wear out the drive quite relatively quickly, which makes physically addressed SSDs impractical for any job that involves modifying small amounts of data on a regular basis.

To solve these and other problems, a journaling file system or flash translation layer (FTL) can be used, in which data to be written is stored to the flash in essentially the order it arrives, and a mapping table between the "apparent address" or virtual address and the "actual physical address" is maintained by the flash controller. The foregoing is a simplified description, but should serve to help understand the principles and advantages of certain embodiments of the invention.

Under a journaling file system, write amplification factors approaching of $1/(2u-u^2)$ can be achieved, in which u is the proportion of the drive that is not currently full of data. Maintaining write amplification at a relatively low value throughout the life of a device can help achieve high throughput, good flash life expectancy, and low thermal dissipation.

Error Correction Coding

One way of improving the performance of an ECC solution is to expand the size of the error correction block (information portion of a codeword) over which the ECC is applied. Two-dimensional "Turbo Product Codes", with iterative decode are a way of creating very large block codes while maintaining a reasonable circuit size and power.

However, if the information portion of a turbo code block is substantially larger than a typical user data request, the resulting solution will suffer from high latency and wasted throughput. This occurs because in order to decode even a small portion of a codeword, the entire codeword must still be read from flash storage. The latency goes up because the ECC decode operation cannot be completed until the entire block is read. Also, this additional data access can lower throughput for the SSD.

The illustrated embodiment replaces a conventional 1-dimensional BCH ECC code with a 2-dimensional turbo code formed from block ECC codes. In one embodiment, the 2 dimensions (for primary and grid ECC) are each orthogonal to each other such that a codeword of one dimension shares at most one symbol with a codeword of another dimension. In another embodiment, the primary and grid codewords are either disjoint or at least partially orthogonal to each other. Table I summarizes primary and grid error correction characteristics according to one embodiment of the invention.

TABLE I

| Type of Error Correction | Data Protection |
|---|---|
| Primary | within a page stripe |
| Grid | within a page grid |

Orthogonality refers to the way in which one set of codewords and another set of codewords relate. In particular, given a codeword from a first set and a codeword from a second set, orthogonality refers to the number of symbols at which the codewords intersect. Two codeword sets are exactly orthogonal if they intersect at exactly one symbol. To the extent that 2 codewords intersect at more than one symbol, they are only partially orthogonal. When two codewords do not share any symbols, they are disjoint. Symbol sets are orthogonal if all members from a first set are orthogonal or disjoint with respect to a second set. Note that a symbol for a BCH code or a LDPC code is a bit, while for an RS code a symbol is m bits, where m is the order of the code.

A high degree of orthogonality reduces the chances that a small pattern of errors is uncorrectable by the ECC scheme. In one embodiment, the orthogonality of the primary and grid dimensions are implemented by selecting data for each primary and grid codeword based on a predetermined interleave pattern.

For example, in the illustrated embodiment, the block data portion of the primary codewords can be taken sequentially as is common practice for ECC on flash pages. The block data portion of the grid codewords can be taken by, for example, taking a bit of data, then skipping an amount of data at least equal to the block data size of a primary codeword to take the next bit of data for the block data portion of the grid codeword, and so on, until the block data portion of the grid codeword is filled. The skipping of data can be implemented by utilizing an appropriately sized skip factor in interleaving. The subsequent grid codeword can retain the pattern with a one bit or more shift to capture new data, and so on.

As will be explained later, decoding of the foregoing structure can be quite efficient. For the usual case in which the data is relatively uncorrupted, primary ECC decoding alone can confirm good data or correct the correctable errors such that data can usually be retrieved with relatively low latency. However, additional error correction is available to be invoked as needed, giving the best of low latency and more robust error correction.

One embodiment of the invention avoids wasted-throughput and latency problems by choosing the primary ECC such that it can be decoded using hard-decision decoding, with only part of the total page stripe available, and with only a single read, at least 99% of the time. Most of the time, only the primary codewords containing the user-requested data need to be fetched, and the user data can be released after only a primary decoding operation. Only when the primary decoding operation is unable to perform the correction with high certainty does a higher latency decode operation need to be invoked. The primary ECC and its decode algorithm should be carefully chosen so that, even in the presence of relatively high bit error rate, the primary ECC can correct the errors present with a relatively high probability, for example, in one embodiment, at least 99% of the time, and almost never performs a "false decode." Other values are applicable, such as, but not limited to, at least 99.9% of the time (if latency or throughput are highly prioritized vs. flash utilization efficiency), at least 95% of the time, or at least 90% of the time (if flash utilization efficiency is highly prioritized relative to latency and throughput). Typically, it will be desirable to keep an expected amount of latency relatively low. The average amount of latency can be estimated by summing (a) the length of time that it takes to read the data and perform primary hard-decision decoding; (b) the probability that the data is not released after primary decoding times the length of time that it takes to read a full page grid and perform the primary/grid iterative decoding operation.

A false decode occurs when the primary ECC decoding process deduces that it has properly corrected the data, when in fact it has added errors. If a false decode occurs without detection, incorrect data would be released, which is an occurrence that should be kept to a very low level. For example, the false decode rate should be less than 1E-20.

A desired maximum rate of false decodes can be guaranteed by adding a suitable CRC chosen based on a modeled false decode probability, plus suitable design margin. In the event that the initial pass of primary decoding cannot correct the requested data, then additional reads with different flash media settings may be made, and soft decoding techniques employed. If those techniques are also unable to correct the requested data, then additional redundancy, such as grid parity, can be used to recover the data. Grid decoding is time-consuming, so the gears should be managed to ensure it is a rare event, for example no more than 1 per 1E6 decodes.

FIG. 2A illustrates an example of a block diagram for a solid-state drive controller 200 according to an embodiment of the invention. FIG. 2B illustrates an example of an array of flash die. It will be understood that the various blocks or circuits of the SSD controller 200 can be rearranged, combined, and/or further divided into smaller blocks. In addition, the SSD controller 200 can be integrated into a single integrated circuit or can be embodied by multiple integrated circuits. The illustrated SSD controller 200 includes a storage communications interface 202, a flash management processor 204, a random access memory (RAM) 206, the journaling engine 208, the ECC encoder/decoder 210, a flash stripe controller 212, flash protocol controllers 214, and flash memory devices 216a-216d. The SSD controller 200 is outside of the flash memory devices 216 and is not the same as the controllers within the flash memory devices 216a-216d. In one embodiment, there are at least 16 different flash memory devices 216a-216d in the storage array.

The storage communications interface 202 handles communication with a host, such as with an input/output circuit of a server. The storage communications interface 202 can conform to any of a variety of protocols, such as small computer system interface (SCSI), PCI-Express, serial ATA (SATA), external SATA (eSATA), universal serial bus (USB), IEEE-1394 (FireWire), or the like. In one embodiment, the SSD controller communicates with the host at a minimum of 50,000 allocation blocks per second. The flash management processor 204 can perform firmware functions, translation layer functions, maintains the association between pages and the gear used, initiates initialization bit error rate commands, and the like. The RAM 206, which can be either SRAM or DRAM, can be used to temporarily hold, that is, cache, data. Other components of the SSD can use the RAM 206 as needed for scratchpad memory. For example, a page, page stripe, or page grid can be read into the RAM 206, and the interleaving/de-interleaving and error correction decoding operations can performed on the data transferred to the RAM 206. The RAM 206 is typically volatile memory and should accordingly be used only for temporary storage. The journaling engine 208 performs the journaling or flash translation layer activities. The ECC encoder/decoder 210 performs encoding and decoding of information data and ECC parity for both primary parity and grid parity. The flash stripe controller 212 provides services, takes a slice of data that has been encoded and distributes it among the n lanes and returns an acknowledgement when done. In the illustrated embodiment, 4 lanes 218a-218d are shown.

When performing a read, the flash stripe controller 212 retrieves the corresponding data and reassembles a page of data. Typically, the data buses for the flash memory devices 216a-216d are arranged in lanes, such as lanes of 8 bits wide each. For example, these flash memory devices can correspond to flash memory chips or to packaged flash memory devices. Flash protocol controllers 214 can provide registers for read and/or write caching, can provide address information, can provide timing signals, read and write signals, and the like. In the illustrated embodiment, a controller from the flash protocol controllers 214 is instantiated for each bus.

In one embodiment, the SSD controller 200 is implemented in an integrated circuit, such as by an application specific integrated circuit (ASIC), a field programmable gate array (FPGA), which can include firmware or software instructions stored in a tangible, non-transitory computer-readable medium executed by a processor, or in a block of hardware shared by several decoders. In one embodiment, the ECC encoders and decoder for both primary and grid parity are performed by dedicated hardware, and gear selection is performed by firmware. In one embodiment, portions that are not expected to be used frequently, such as grid parity recovery, may advantageously be implemented in firmware or software, or in a block of hardware shared by several decoders. In addition, it should be noted that the disclosed techniques are applicable to use "in the field," such as in a server, and accordingly differ from techniques used by an engineer during a design phase or during manufacturing and test. Further, it should be noted that an integrated circuit for the SSD controller 200 is separate from the flash memory devices 216a-216d.

Figure 3:
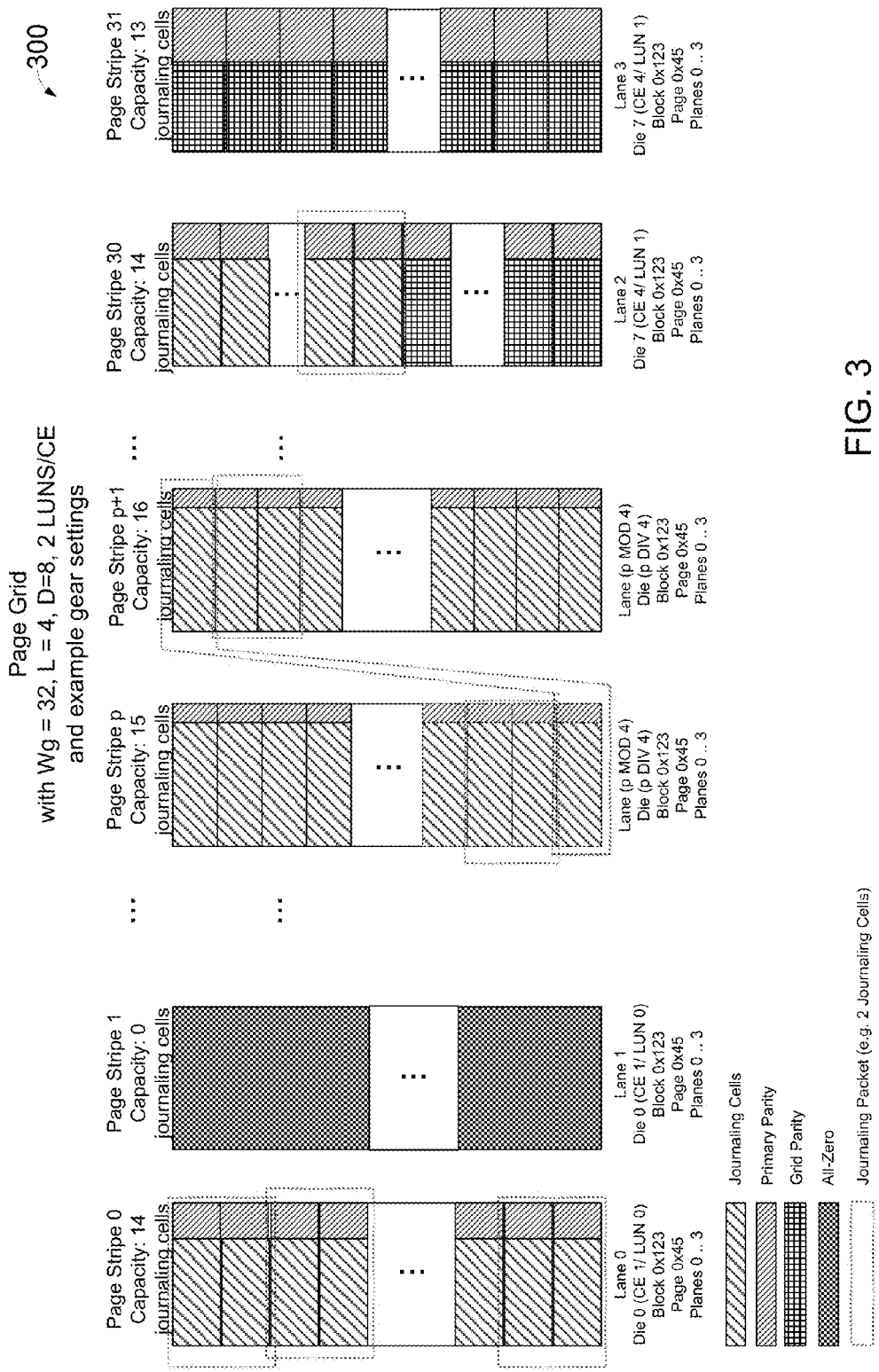
FIG. 3 illustrates an example of a page grid.

FIG. 3 illustrates an example of a page grid 300. In the illustrated example, 32 page stripes form the page grid. For example, a page stripe 0 has a capacity of 14 journaling cells, a page stripe 1 has a capacity of 0 journaling cells, a page stripe p has a capacity of 15 journaling cells, and so forth. As can be seen in FIG. 3, the amount of primary parity available in a page stripe varies based on the journaling cell capacity. However, note that when the page stripe has a capacity of 0 journaling cells, the page stripe is identically empty of both journaling cells and primary parity. Dashed boxes indicate storage of a journaling packet in a situation in which a journaling packet is stored across two journaling cells. It is possible for a journaling packet to span two page stripes, but because page stripes addresses have simple arithmetic relationships, the address of the first journaling cell of a journaling packet, together with the page stripe capacity information, suffices to locate all journaling cells of a journaling packet.

Together, a group of F flash dies make up the flash array for a lane group. Various pages from memory are grouped into page stripes and into page grids. A page stripe includes one or more pages that have the same page index and the same block index, except for the part of the block address that denotes a plane or LUN. In one embodiment, a page stripe includes 4 or more pages. Preferably, a page stripe includes 4 pages that can be accessed at substantially the same time from the same die. In another embodiment, a page stripe includes 2 pages each from 2 separate die. The number of page stripes can vary in a wide range and an applicable number will be readily determined by one of ordinary skill in the art.

Each page stripe is grouped with page stripes on other dice sharing the same page and block index to form a page grid. A page grid can span up to Wg page stripes. In one embodiment, Wg is 32, but can vary in a very broad range.

A page stripe can hold information, such as user data or grid parity, and can hold primary ECC parity protective of the information. Each page stripe in a page grid has a capacity for the information, measured in journaling cell slots, is determined by the gear assigned to that page stripe. In one embodiment, the capacity of a page stripe is an integer multiple of journaling cell slots. A slot corresponds to a space. In an alternative embodiment, the capacity of a page stripe can be a non-integer. In the illustrated examples, the capacity of a page stripe is an integer multiple of journaling cells.

In one embodiment, each journaling cell slot can store one journaling cell. However, each journaling cell can hold one or more journaling packets. In one embodiment, a logical block of data corresponds to a journaling packet. For example, in one embodiment, a journaling packet and a journaling cell are the same size, but in another embodiment, the journaling packet and the journaling cell can be different sizes, such as 2 journaling packets for each journaling cell. The use of the journaling packet can permit the more efficient utilization of space within page stripes and page grids. However, it will be appreciated that a journaling packet is not necessary when the journaling packet and the journaling cell are the same size.

The capacity of a particular page stripe depends on the gear assigned to the page stripe. The gear is selected from a plurality of gears includes gear zero (G0), which specifies a capacity of zero journaling cells. Other gears of the plurality have capacities greater than zero. By varying the capacity of journaling cells, the amount of memory space remaining in the page stripe varies, which in turned is used for the storage of primary ECC parity and affects the correction capability of the primary ECC. In one embodiment, page stripes in gear 1 hold 16 journaling cells, those in gear 2 hold 15 journaling cells, those in gear 3 hold 14 journaling cells, and those in gear 4 hold 12 journaling cells as illustrated in Table II.

TABLE II

| Gear | # of journaling cells |
|---|---|
| Gear 0 | 0 |
| Gear 1 | 16 |
| Gear 2 | 15 |
| Gear 3 | 14 |
| Gear 4 | 12 |

Other capacities will be applicable and will be readily determined by one of ordinary skill in the art. For example, the capacities can vary based on the size of the journaling cells, the size of the page stripes, the estimated bit error rates of the media underlying the memory devices, the desired correction capability, and the like.

The total journaling cell capacity of the page grid corresponds to the sum of the capacities of its constituent page stripes and should be an integer multiple regardless of whether or not the underlying page stripes have capacities that are integer multiples. However, some journaling cell slots of the page grid are reserved for the storage of grid parity so that the effective capacity Cg of the page grid is the sum of the individual capacities of its constituent page stripes minus a number Pg of journaling cell slots reserved for grid parity. In one embodiment, the gear associated with each page stripe of a page grid is independent selected from the others.

Grid parity data is protective of the data across the page grid. Accordingly, the data to be stored in the page grid should be known before the grid parity data can be finalized. However, the grid parity data can be partially computed as data is allocated to the various page stripes of the page grid. In one embodiment, the grid parity data is allocated to the last journaling cell slots of a page grid for convenience. In one embodiment, the number Pg of journaling cell slots reserved for grid parity is 20 when recovery from a complete die failure is desired, and 8 when it is not.

When journaling cells are to be written to the flash memory, the journaling cells are assigned to a page stripe, up to a maximum number determined by the page stripe capacity, which is determined by the corresponding gear for the page stripe. Primary parity bits for ECC is calculated for the page stripe according to its gear. As each page stripe is filled, it may be written to the appropriate flash. It will be understood that data can be maintained in RAM 206 until ready to be programmed to the appropriate flash.

One embodiment uses a lookup table to manage the location of logical blocks. For example, a lookup table can include the following: a logical block address for an index, a page grid number (if there is more than one page grid present), a page stripe number, and a journaling cell number. The numbers can correspond to counts and/or address offsets. The same table or a separate table can store the gear corresponding to the page stripe. When journaling packets are used and are larger than journaling cells, such as when a journaling packet is stored in two journaling cell slots, no separate entry is needed for the second journaling cell slot as the SSD controller 200 can standardize on having the journaling packet stored in consecutive journaling cell slots.

The grid parity comprises an erasure code, such as a Reed-Solomon code, and is stored in the journaling cells allocated to grid parity. Grid parity permits recovery of data in situations in which the page stripe's primary parity cannot provide recovery by itself. A set of Wt grid codewords is defined, each codeword having a total size Nt symbols, and a payload of Kt symbols. The bits of each page stripe, including primary ECC parity, are assigned to grid codewords. In the illustrated embodiments, the grid parity of the grid codewords is stored in the final Pg journaling cell slots of a page grid, which are in turn protected by primary parity, just as if they contained regular user data.

The value Wt and the assignment sequence are chosen such that each page stripe has no more than (Nt−Kt) symbols in each grid codeword, each symbol being Mt bits, and that the intersection of any primary codeword with any grid codeword contains the same number of symbols as any other, plus or minus one symbol.

In one embodiment, the grid error correction code is a Reed-Solomon code constructed on Galois Field GF($2^{10}$ or $2^{10}$), a symbol is Mt=10 bits, Wg is 32 page stripes, each page stripe comprises four pages of up to 9472 bytes each, and Wt is 1080 codewords.

In one embodiment, each byte of data is striped bitwise across eight grid codewords for interleaving, starting from codeword 0. Additional bytes are allocated until each of the eight grid codewords has a complete Mt-bit symbol. The next Mt bytes are striped across the next eight codewords, and so on until every grid codeword has one complete symbol. Then the process starts again, filling the second symbol of each grid codeword. When the end of a page stripe is reached, any unfilled bits in the 8 codewords are assumed to be zero.

Page Stripes in Gear Zero

Advantageously, embodiments of the invention can allocate a journaling cell storage capacity of zero to a page stripe. When a page stripe is associated with Gear zero (G0), the page stripe has zero capacity for journaling cells. Page stripes may be set to Gear zero for many reasons, such as, but not limited to, the following: (a) The page stripe resides on a die, plane, or block that is known to have failed. (b) The page stripe resides on a factory bad block. (c) The raw bit error rate (RBER) of the page stripe is too high for any ECC gear to decode with high confidence. (d) It is not advantageous for data to be stored on the page stripe because of its impact on the bit error rate of other pages. For example, in MLC NAND flash with two bits stored in each flash cell, one on each of two "paired" or "bonded" pages. Programming one page of the pair with data using a gear with a non-zero journaling cell capacity, and the other with a fixed pattern (or not at all) with gear zero can result in a much reduced RBER on the page with the data. When flash is severely degraded, using just one page of a pair, with the other set to gear zero, can allow continued use of the flash cell when otherwise both pages would be retired. (e) A grid size of smaller than Wg has been chosen. For example, if 1-for-8 die failure protection is desired, and Wg is 32, then 24 page stripes of each page grid, such as the last 24 page stripes, can be set to gear zero to implement the reduction in size. (f) The die on which the page stripe would have resided is not actually present in the system, for example, when a finer granularity of initial op is used. For example, if the total number of page stripes is not an integer multiple of Wg, then there are leftover page stripes with fewer than Wg page stripes. Ordinarily, these leftovers could not be used, but by associating the not present page stripes with gear zero, the other leftover page stripes can be used.

In one embodiment, the following rules apply to a G0 page stripe: (a) The G0 page stripe has no journaling cell slots and cannot hold journaling cells or grid parity cells. If the G0 page stripe is written at all, a determinable pattern should be used, such as all zeroes, all ones, or a substantial duplicate of the data on a corresponding bonded page stripe. It should be noted that there can also exist mapping between the 2 or 3 bits to store on a MLC cell and the corresponding electrons stored in the floating gates of the MLC cell. (b) The G0 page stripe should not be read. (c) The Grid ECC treats the contents of G0 page stripe as identically zero, for both encoding and decoding. Grid ECC codewords containing symbols from a G0 Page Stripe are effectively shortened by the corresponding number of symbols.

Examples of Grid Arrangements

As illustrated in FIGS. 2B and 3, in one embodiment, page stripes are arranged across the L lanes, with D*L dies total. For the flash array, D indicates the depth of the flash memory as shown in FIG. 2B and can be a relatively large number depending on the size of the array of flash dice. In the illustrated embodiments, the pages of a page stripe are within a particular die. However, in alternative embodiments, the pages of a page stripe can be spread to two or more dice.

A page stripe p can be located on lane (p MOD L), where MOD indicates modulo such that p MOD L is the remainder of p divided by L. For example, L can be 4 in one embodiment. The page stripe's die index is ((p DIV L)+Sd) MOD D, where Sd is a starting die index and DIV indicates the quotient of p divided by L, rounded down. The die index can be converted to a Chip Enable (CE) and LUN index by any convenient one-to-one mapping; in one embodiment this mapping is lun_index=die_index MOD 2, CE_index=die_index DIV 2.

A 32-element page grid (Wg=32), implemented 4 lanes wide and 8 dies deep, with example capacities, determined by the example gear setting of Table II, is shown. In the illustrated example, the grid parity has a size of 20 journaling cells per page grid.

| | Lane | | | |
|---|---|---|---|---|
| Die | 0 | 1 | 2 | 3 |
| 0 | Page Stripe 0 Gear 1 Capacity 16 | Page Stripe 1 Gear 2 Capacity 15 | Page Stripe 2 Gear 1 Capacity 16 | Page Stripe 3 Gear 3 Capacity 14 |
| 1 | Page Stripe 4 Gear 1 Capacity 16 | Page Stripe 5 Gear 1 Capacity 16 | Page Stripe 6 Gear 3 Capacity 14 | Page Stripe 7 Gear 4 Capacity 12 |
| 2..5 | | | | |
| 5 | Page Stripe 24 Gear 1 Capacity 16 | Page Stripe 25 Gear 1 Capacity 16 | Page Stripe 26 Gear 3 Capacity 14 | Page Stripe 27 Gear 3 Capacity 14 |
| 7 | Page Stripe 28 Gear 3 Capacity 14 | Page Stripe 29 Gear 4 Capacity 12 | Page Stripe 30 Gear 1 Capacity 8 user +8 Grid Parity | Page Stripe 31 Gear 4 Capacity 12 Grid Parity |

If only 24 dies were populated, the page grid of size Wg=32 can be arranged as follows:

| | Lane | | | |
|---|---|---|---|---|
| Die | 0 | 1 | 2 | 3 |
| 0 | Page Stripe 0 Gear 1 Capacity 16 | Page Stripe 1 Gear 2 Capacity 15 | Page Stripe 2 Gear 1 Capacity 16 | Page Stripe 3 Gear 3 Capacity 14 |
| 2 | Page Stripe 4 Gear 1 Capacity 16 | Page Stripe 5 Gear 1 Capacity 16 | Page Stripe 6 Gear 3 Capacity 14 | Page Stripe 7 Gear 4 Capacity 12 |
| 3..5 | | | | |
| 6 | Page Stripe 20 Gear 1 Capacity 16 | Page Stripe 21 Gear 1 Capacity 16 | Page Stripe 22 Gear 3 Capacity 8 user +6 Grid Parity | Page Stripe 23 Gear 3 Capacity 14 Grid Parity |
| N/A | Page Stripe 24 Gear 0 Capacity 0 | Page Stripe 25 Gear 0 Capacity 0 | Page Stripe 26 Gear 0 Capacity 0 | Page Stripe 27 Gear 0 Capacity 0 |
| N/A | Page Stripe 28 Gear 0 Capacity 0 | Page Stripe 29 Gear 0 Capacity 0 | Page Stripe 30 Gear 0 Capacity 0 | Page Stripe 31 Gear 0 Capacity 0 |

If Page Stripe 7 was no longer usable even under the highest gear, that is, the gear having the smallest non-zero journaling cell capacity, or if Die 2 of Lane 3 had failed, or for some other reason it is not desirable to store data using Page Stripe 7, then the page grid can be arranged as follows:

| | Lane | | | |
|---|---|---|---|---|
| Die | 0 | 1 | 2 | 3 |
| 0 | Page Stripe 0 Gear 1 Capacity 16 | Page Stripe 1 Gear 2 Capacity 15 | Page Stripe 2 Gear 1 Capacity 16 | Page Stripe 3 Gear 3 Capacity 14 |
| 2 | Page Stripe 4 Gear 1 Capacity 16 | Page Stripe 5 Gear 1 Capacity 16 | Page Stripe 6 Gear 3 Capacity 14 | Page Stripe 7 Gear 0 Capacity 0 |
| 3..6 | ... | ... | ... | ... |
| 7 | Page Stripe 24 Gear 1 Capacity 16 | Page Stripe 25 Gear 1 Capacity 16 | Page Stripe 26 Gear 3 Capacity 14 | Page Stripe 27 Gear 3 Capacity 14 |
| 8 | Page Stripe 28 Gear 3 Capacity 14 | Page Stripe 29 Gear 4 Capacity 12 | Page Stripe 30 Gear 1 Capacity 8 user +8 Grid Parity | Page Stripe 31 Gear 4 Capacity 12 Grid Parity |

Similarly, if page stripes 30 and 31 were to subsequently fail, the page grid can be arranged as follows:

| | Lane | | | |
|---|---|---|---|---|
| Die | 0 | 1 | 2 | 3 |
| 0 | Page Stripe 0 Gear 1 Capacity 16 | Page Stripe 1 Gear 2 Capacity 15 | Page Stripe 2 Gear 1 Capacity 16 | Page Stripe 3 Gear 3 Capacity 14 |
| 2 | Page Stripe 4 Gear 1 Capacity 16 | Page Stripe 5 Gear 1 Capacity 16 | Page Stripe 6 Gear 3 Capacity 14 | Page Stripe 7 Gear 0 Capacity 0 |
| 3..6 | ... | ... | ... | ... |
| 7 | Page Stripe 24 Gear 1 Capacity 16 | Page Stripe 25 Gear 1 Capacity 16 | Page Stripe 26 Gear 3 Capacity 14 | Page Stripe 27 Gear 3 Capacity 14 |
| 8 | Page Stripe 28 Gear 3 Capacity 6 user +8 Grid parity | Page Stripe 29 Gear 4 Capacity 12 Grid Parity | Page Stripe 30 Gear 0 Capacity 0 | Page Stripe 31 Gear 0 Capacity 0 |

If more than Wg dies are populated, then multiple page grids with the same page/block address, but having different page grid starting indexes can advantageously exist. In the example below, a first page grid (grid 0) is 4 lanes by 16 dies and a second page grid (grid 1) is 4 lanes by 15 dies. The use of gear 0 provides an efficient way to adapt a page grid to the available die of a solid-state drive.

| Die | Lane | | | |
|---|---|---|---|---|
| Index | 0 | 1 | 2 | 3 |
| 0 | Grid 0 Start<br>Page Stripe 0<br>Gear 1<br>Capacity 16 | Page Stripe 1<br>Gear 2<br>Capacity 15 | Page Stripe 2<br>Gear 1<br>Capacity 16 | Page Stripe 3<br>Gear 3<br>Capacity 14 |
| 1 | Page Stripe 4<br>Gear 1<br>Capacity 16 | Page Stripe 5<br>Gear 1<br>Capacity 16 | Page Stripe 6<br>Gear 3<br>Capacity 14 | Page Stripe 7<br>Gear 4<br>Capacity 12 |
| 2..6 | | | | |
| 7 | Page Stripe 28<br>Gear 3<br>Capacity 14 | Page Stripe 29<br>Gear 4<br>Capacity 12 | Page Stripe 30<br>Gear 1<br>Capacity 8 user<br>+8 Grid Parity | Page Stripe 31<br>Gear 4<br>Capacity 12<br>Grid Parity |
| 8 | Grid 1 Start<br>Page Stripe 0<br>Gear 1<br>Capacity 16 | Page Stripe 1<br>Gear 1<br>Capacity 16 | Page Stripe 2<br>Gear 0<br>Capacity 0 | Page Stripe 3<br>Gear 3<br>Capacity 14 |
| 9..13 | | | | |
| 14 | Page Stripe 24<br>Gear 1<br>Capacity 16 | Page Stripe 25<br>Gear 1<br>Capacity 16 | Page Stripe 26<br>Gear 3<br>Capacity 6 User<br>+8 Grid Parity | Page Stripe 27<br>Gear 3<br>Capacity 12<br>Grid Parity |
| N/A | Page Stripe 28<br>Gear 0<br>Capacity 0 | Page Stripe 29<br>Gear 0<br>Capacity 0 | Page Stripe 30<br>Gear 0<br>Capacity 0 | Page Stripe 31<br>Gear 0<br>Capacity 0 |

If 32 dies were populated, but it was desired to have 1-for-8 protection against die failure, the page grid can be arranged as follows:

| | | | | |
|---|---|---|---|---|
| 0 | Grid 0 Start<br>Page Stripe 0<br>Gear 1<br>Capacity 16 | Page Stripe 1<br>Gear 2<br>Capacity 15 | Page Stripe 2<br>Gear 1<br>Capacity 16 | Page Stripe 3<br>Gear 3<br>Capacity 14 |
| 1 | Page Stripe 4<br>Gear 1<br>Capacity 16 | Page Stripe 5<br>Gear 1<br>Capacity 16 | Page Stripe 6<br>Gear 1<br>Capacity 8 user<br>+8 Grid Parity | Page Stripe 7<br>Gear 4<br>Capacity 12<br>Grid Parity |
| N/A | Grid 0 Page Stripes 8..31: Gear 0 Capacity 0 | | | |
| 2 | Grid 1 Start<br>Page Stripe 0<br>Gear 1<br>Capacity 16 | Page Stripe 1<br>Gear 2<br>Capacity 15 | Page Stripe 2<br>Gear 1<br>Capacity 16 | Page Stripe 3<br>Gear 3<br>Capacity 14 |
| 3 | Page Stripe 4<br>Gear 1<br>Capacity 16 | Page Stripe 5<br>Gear 1<br>Capacity 16 | Page Stripe 6<br>Gear 1<br>Capacity 10 user<br>+6 Grid Parity | Page Stripe 7<br>Gear 3<br>Capacity 14<br>Grid Parity |
| N/A | Grid 1 Page Stripes 8..31: Gear 0 Capacity 0 | | | |
| 4 | Grid 2 Start<br>Page Stripe 0<br>Gear 1<br>Capacity 16 | Page Stripe 1<br>Gear 2<br>Capacity 15 | Page Stripe 2<br>Gear 1<br>Capacity 16 | Page Stripe 3<br>Gear 3<br>Capacity 14 |
| 5 | Page Stripe 4<br>Gear 1<br>Capacity 16 | Page Stripe 5<br>Gear 1<br>Capacity 16 | Page Stripe 6<br>Gear 2<br>Capacity 10 user<br>+5 Grid Parity | Page Stripe 7<br>Gear 2<br>Capacity 15<br>Grid Parity |
| N/A | Grid 2, Page Stripes 8..31: Gear 0 Capacity 0 | | | |
| 6 | Grid 3 Start<br>Page Stripe 0<br>Gear 1<br>Capacity 16 | Page Stripe 1<br>Gear 2<br>Capacity 15 | Page Stripe 2<br>Gear 1<br>Capacity 16 | Page Stripe 3<br>Gear 3<br>Capacity 14 |
| 7 | Page Stripe 4<br>Gear 1<br>Capacity 16 | Page Stripe 5<br>Gear 1<br>Capacity 16 | Page Stripe 6<br>Gear 1<br>Capacity 11 user<br>+5 Grid Parity | Page Stripe 7<br>Gear 2<br>Capacity 15<br>Grid Parity |
| N/A | Grid 3, Page Stripes 8..31: Gear 0 Capacity 0 | | | |

Allocation of Page Stripe Data to Grid Codewords

Figure 4:
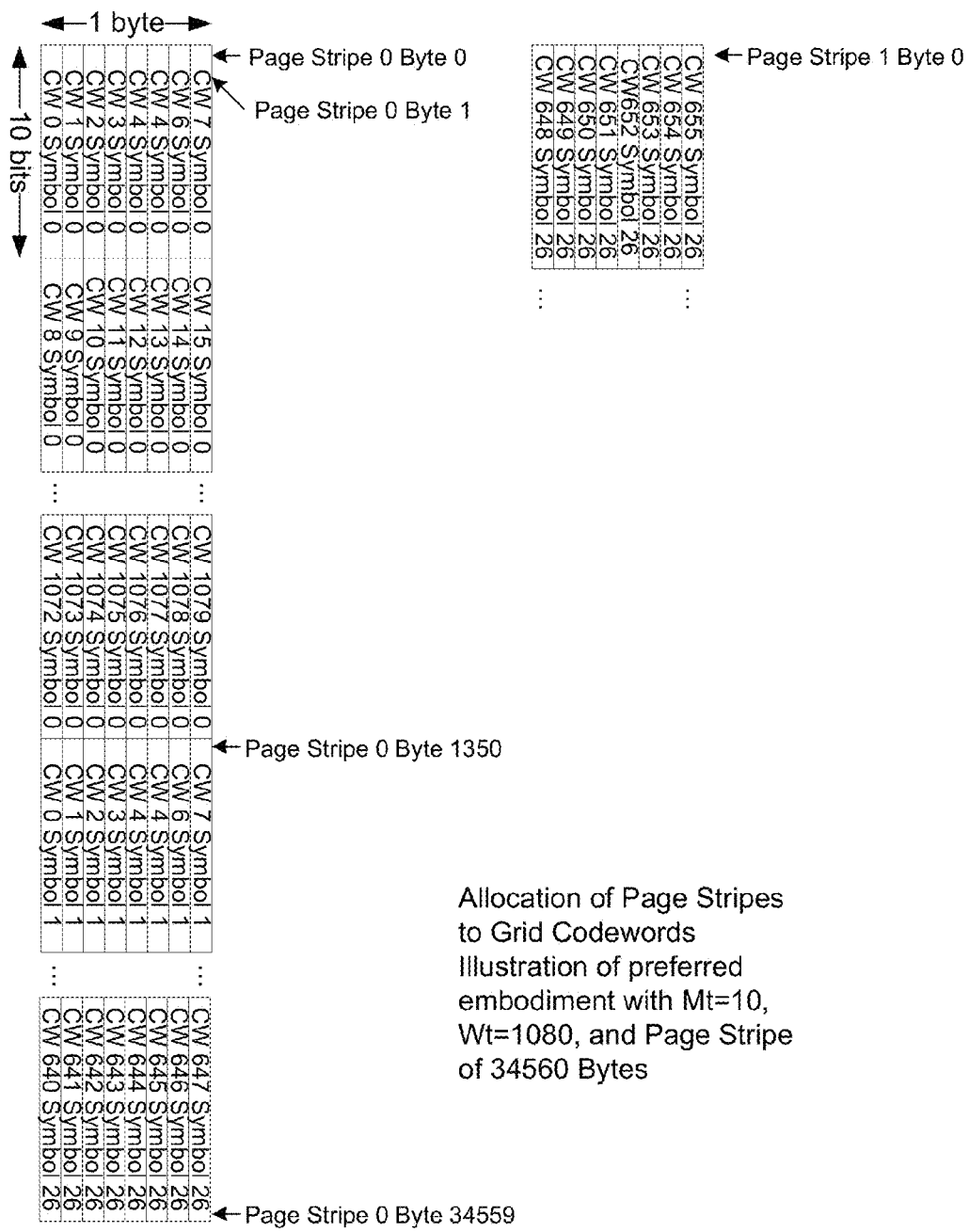
FIG. 4 illustrates an example of allocation of page stripe data to grid codewords.

FIG. 4 illustrates an example of allocation of page stripe data to grid codewords. As each symbol of each grid codeword is filled, the grid parity for that codeword is updated and stored. When the last journaling cell of user data is processed, the grid parity can be finalized. In one embodiment, this grid parity is broken up for storage into journaling cell slots of the same size as journaling cell slots for journaling cells of user data, such as slots of 2048 bytes, 2080 bytes, 2112 bytes or 2120 bytes. Of course, other journaling cell slot sizes will be applicable. The grid parity is processed by the primary encoder to generate primary parity bits over the grid parity, and can be programmed to the flash. Note that the journaling engine 208 should leave enough journaling cell slots at the end of each page grid so that, at the current gear settings, there is room for programming of the grid parity.

Figure 5:
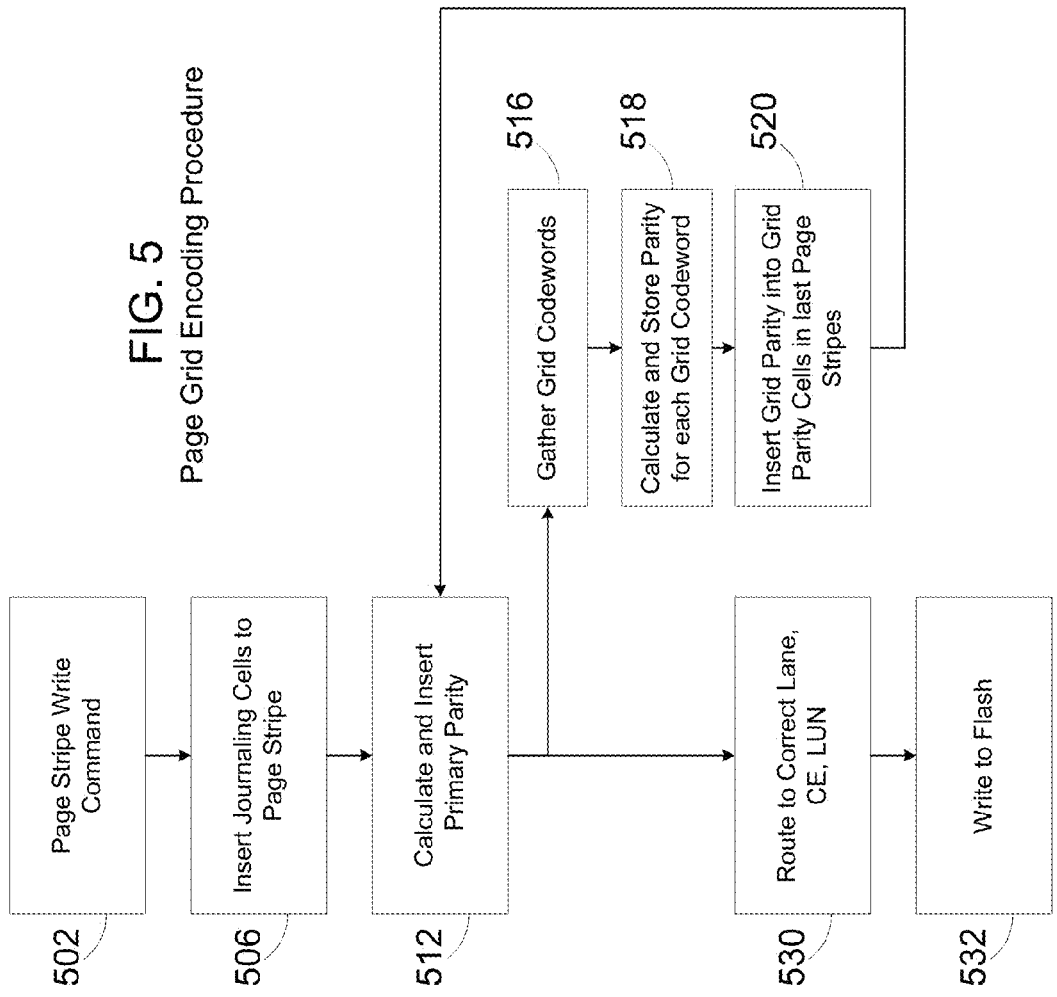
FIG. 5 illustrates an example of a process for page grid encoding.

FIG. 5 illustrates an example of an overview process for page grid encoding. It will be appreciated by the skilled practitioner that the illustrated process can be modified in a variety of ways. For example, in another embodiment, various portions of the illustrated process can be combined, can be rearranged in an alternate sequence, can be removed, or the like. While page grid encoding is illustrated, some aspects of page stripe encoding are also discussed. Other aspects of both page stripe and page grid encoding will be described in greater detail later in connection with FIG. 9. The process can be implemented by software or firmware executed by a processor, by hardware, or by a combination of both software or firmware and hardware. For example, the process can be performed by the SSD controller 200 (FIG. 2A). It will be appreciated by the skilled practitioner that the illustrated process can be modified in a variety of ways. For example, in one embodiment, various stages can be implemented in a pipelined fashion and/or performed in parallel. For example, in another embodiment, various portions of the illustrated process can be combined, can be rearranged in an alternate sequence, can be removed, or the like. At the start of the process, it is assumed that, when variable, a particular gear with non-zero journaling cell capacity has been selected for the various page stripe.

The process begins in a stage 502 in which the process receives a page stripe write command and the journaling packet(s) to be written to the page stripe. The page stripe write command and the data can be received from a journaling engine 208 (FIG. 2A). As will be explained later, data can also correspond to error correction code from earlier-in-time encoding. The process advances from the stage 502 to a stage 506. The capacity in terms of the number of journaling cell slots of a page stripe can be pre-arranged based on the gear selected for the page stripe.

In the stage 506, the journaling packets are arranged into journaling cells for writing to the page stripe. For example, a journaling packet can span two journaling cells. In addition, in some embodiments, a journaling packet can span the last journaling cell of one page stripe and the first journaling cell of the next page stripe. At the stage 506, the various page stripes of the page grid can be temporarily held in RAM 206 (FIG. 2A), that is, scratchpad memory, until programmed to the flash, which occurs later in a stage 532. Lookup tables storing the association between a logical block/journaling packet and a page grid number, page stripe number, and journaling cell number can also be updated. The process advances from the stage 506 to the stage 512.

In the stage 512, the primary parity bits of ECC code are calculated by the ECC Encoder/Decoder 210 (FIG. 2A) and inserted into the page stripe, which at the stage 512 can be the version of the page stripe stored in RAM 206 (FIG. 2A). In one embodiment, the primary ECC code is a LDPC code. However, other codes, such as BCH codes, can be used. In the illustrated embodiment, the primary parity is then inserted into the page stripe in the space remaining after the journaling cells. The process advances from the stage 512 to a stage 516, a stage 518, and a stage 520 until the last page stripe has been processed by the stage 520, at which point the process advances from the stage 512 to a stage 530.

The stages from the stage 516 through the stage 520 apply to page grid processing, which operates across a span of two or more page stripes, such as four page stripes. The grid parity is protective of the primary codewords, for example, user data stored in journaling cell slots and corresponding primary parity.

In one embodiment, each bit is assigned to a grid codeword. In one embodiment, in which each grid contains Wt grid codewords based on a Reed-Solomon error correction code defined over Galois field $gf(2^{Mt})$ for a particular gear, data from each primary codeword is grouped into symbols of size $2^{Mt}$, and assigned on a symbol-wise round-robin basis to the grid codewords, such that each grid codeword has a substantially equal number of bytes (plus or minus 1) from each primary codeword. In one embodiment, while data from the primary codewords is rearranged to form the information portions of the grid codewords, only the parity portions of the grid codewords are stored as the grid parity. The rearranged bits are passed to the stage 518. Padding of implied zeroes may be used to reach an integer number of symbols, according to the known techniques of shortening RS codewords by partial symbols. The stage 516 preferably includes interleaving.

In the stage 518, the assembled bits are treated as the information bits of a grid ECC code. In a preferred implementation, the grid ECC code is an RS code. In the stage 518, the ECC parity bits corresponding to the information bits of the assembled grid codewords are calculated. In one embodiment, the operation of the stage 512 is as follows. A scratchpad memory of sufficient size for the parity of the grid codewords of the page stripes of one or more grids is provided. The scratchpad memory for each page grid, for example, the page grid 300 (FIG. 3) is set to zero when the first page stripe encode of the page grid is started. Whenever new information bits are assigned to a grid codeword in the stage 516, the current value of the scratchpad for that codeword is read and loaded as the state of a Reed-Solomon encoding linear feedback shift register (LFSR). The new data is shifted into the LFSR, and the revised state written back to scratchpad memory. These LFSR operations can be done in a single cycle or in multiple cycles so that the grid parity can be calculated and updated as page stripes are processed. After the grid codewords for the page grid have been fully calculated, that is, finalized, the process proceeds to the stage 520.

In the stage 520, the grid parity is read from the scratchpad memory, and inserted into journaling cell slots allocated within the page grid, which can still be maintained in RAM at this point in the process. The grid parity is passed back to the stage 512, in which the grid parity is treated as if it were user data. In one embodiment, the content of a journaling cell holding grid parity corresponds to the information portion of a grid codeword protected by ECC parity known as primary parity over grid parity. However, the grid parity can be broken up into sections of different lengths than the ones used for user data.

In the stage 512, the primary parity over grid parity is calculated over these grid parity bits. The amount of primary parity calculated over the grid parity corresponds to the gear selected for the page stripe in which those journaling cells are stored. The output of the stage 512 is then provided to the stage 530.

In the stage 530, the process distributes the data among the n lanes of the SSD to which the data will ultimately be written. The lanes can be parallel data buses to which the flash devices of the SSD are connected. In one embodiment, each lane is an 8 bit wide open NAND flash interface (ONFI) bus or a TOGGLE bus. The distribution of data can be done a variety of ways. For example, bit interleaving can be used to distribute the data. In another example, a first received byte can be allocated to a first lane, a second received byte to a second lane, a third received byte to a third lane, a fourth received byte to a fourth lane, a fifth received byte back to the first lane, and so on, to distribute the data among the lanes in a manner similar to a card dealer dealing cards to players. The distribution of the data can be by, for example, splitting a 32-bit data bus into four separate 8-bit buses, one to each of four protocol controllers 214. In another embodiment, sequentially received data can be used to fill one entire page (or integer fraction) of a page stripe, and then continue on to fill the next page (or integer fraction) of the page stripe, and so forth. The process advances from the stage 530 to the stage 532.

In the stage 532, the process performs the writing to the flash memory. It should be noted that data can be written sequentially to the data or cache register of a flash device, so long as the previously written data is not being changed. Alternately, a complete page stripe of data can be accumulated in a data buffer in the controller prior to any write commands being issued. In addition, when writing relatively large amounts of data, it can be desirable to perform write operations in parallel. For example, a flash memory die can have multiple planes that can be written at the same time. Thus, there can be multiple areas of memory set aside for buffers for page stripes and for tertiary parity calculation.

Data Reading and Recovery

Figure 6:
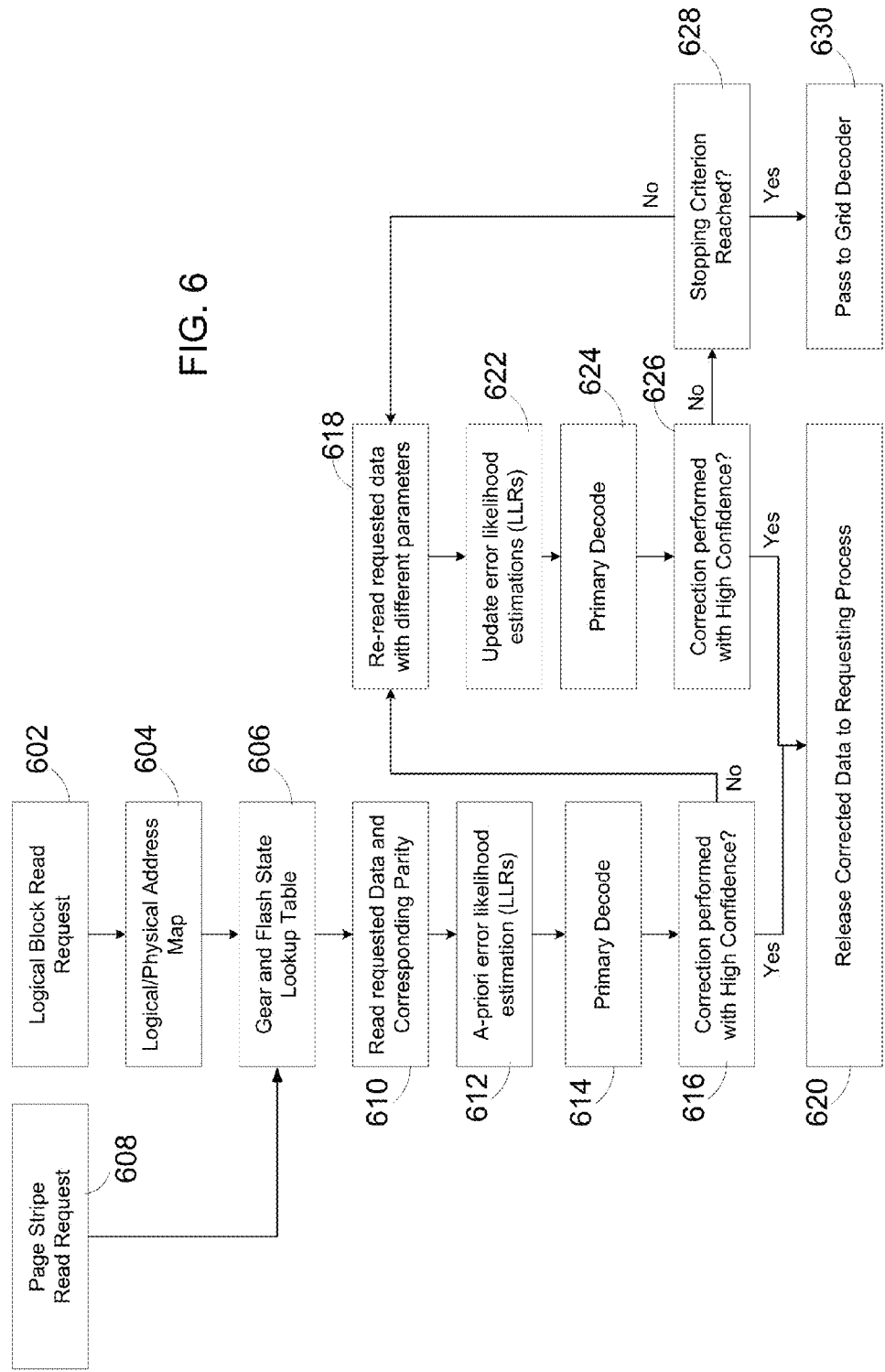
FIG. 6 illustrates a process for decoding using primary parity.

FIG. 6 illustrates an example of a process for decoding with primary parity. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins in a stage 602 in which the process receives a request for a logical block of data. The request can come from a host. The process advances from the stage 602 to a stage 604. In the stage 604, a journaling engine 208 (FIG. 2A) can determines the page stripe(s) on which it resides. For example, the logical block can be associated with a journaling packet, which can be stored in one or more journaling cell slots. A lookup table can be used to locate the physical address corresponding to the logical block. The process advances from the stage 604 to a stage 606.

In the stage 606, the process refers to a lookup table to retrieve the gear associated with the page stripe corresponding to the logical block. In embodiments in which the journaling packet can be split among two or more journaling cell slots, which can be split among two or more page stripes, one entry can be made to stage 606 for each journaling cell in the journaling packet. The process can also optionally retrieve the flash state in the stage 606 for decoding of LDPC codes as will be explained later in a stage 612. Of course, if a different type of primary ECC are used, the particulars of FIG. 6 associated with the LDPC code need not be performed. The process can also enter the stage 606 via a stage 608 in which data is requested without association with a logical block. This can occur during, for example, built in self test (BIST), direct physical addressing, or as part of retrieval of grid parity data. The process advances from the stage 606 to a stage 610.

In the stage 610, the process reads the requested data and the corresponding parity information. For example, a journaling cell can contain the information bits for a primary codeword, and the associated primary parity contains the parity bits of the primary codeword. The process advances from the stage 610 to the stage 612.

In the illustrated embodiment, an LDPC code with as-needed soft decision decoding is used for the primary ECC. However, other codes, such as a BCH code or a two-dimensional quick-release code can alternatively be used. Other error correction codes will also be applicable. In one embodiment, the primary ECC should be capable of providing corrected errors on the media for at least 99% of requests, and should also have a relatively low likelihood (such as 1 in 1E20) of false correction. This likelihood is maintained by controlling the threshold at which page stripes are moved to a different gear.

In the stage 612, the process generates a-priori LLR estimates based on previously determined statistical behaviors of the flash. The process advances from the stage 612 to a stage 614. In the stage 614, the process performs an initial decode of the primary ECC using hard-decision data and the a-priori LLR estimates. The process advances from the stage 614 to a stage 616.

In the stage 616, the process determines whether the primary error correction of the stage 614 was performed with high degree of confidence that the error correction is without error. In the stage 616, the process can check whether a decode was successful or not by a combination of CRC and parity-node checks. If it is determined that the error correction decoding was performed without high confidence, the process proceeds from the stage 616 to the stage 618. Otherwise, for example, if there were zero or more errors and any errors were corrected with high confidence, the process proceeds from the stage 616 to a stage 620.

In the stages 618, 622, 624, the process collects additional soft information by additional reads with different flash parameters, and the process uses that additional soft information to improve its likelihood of a successful decode. The process can return back to the stage 618 to continue trying to decode with different flash parameters until either correction is achieved with high confidence in a stage 626 or a stopping criterion is reached in a stage 628. The determination of high confidence in the stage 626 can be the same as in the stage 616. In one example, a stopping criterion can be reached if at least one of the following is true: (a) a loop counter has reached a predetermined limit, that is, a maximum iteration limit; or (b) no new corrections were made for the stage 624; or (c) the changes performed in two successive executions of the stage 624 were the same. If the correction is performed with high confidence, the process proceeds from the stage 626 to the stage 620. Otherwise, if the iterative loop exits via the stage 628 due to a stopping criterion being reached, the process advances to a stage 630 for grid decoding as the primary ECC could not provide reliable data by itself.

In the stage 620, the requested data can be provided to the host and indicated as correct. Of course, if the requested data corresponds instead to grid parity, the grid parity can be provided to the ECC encoder/decoder 210 (FIG. 2A).

Figure 7:
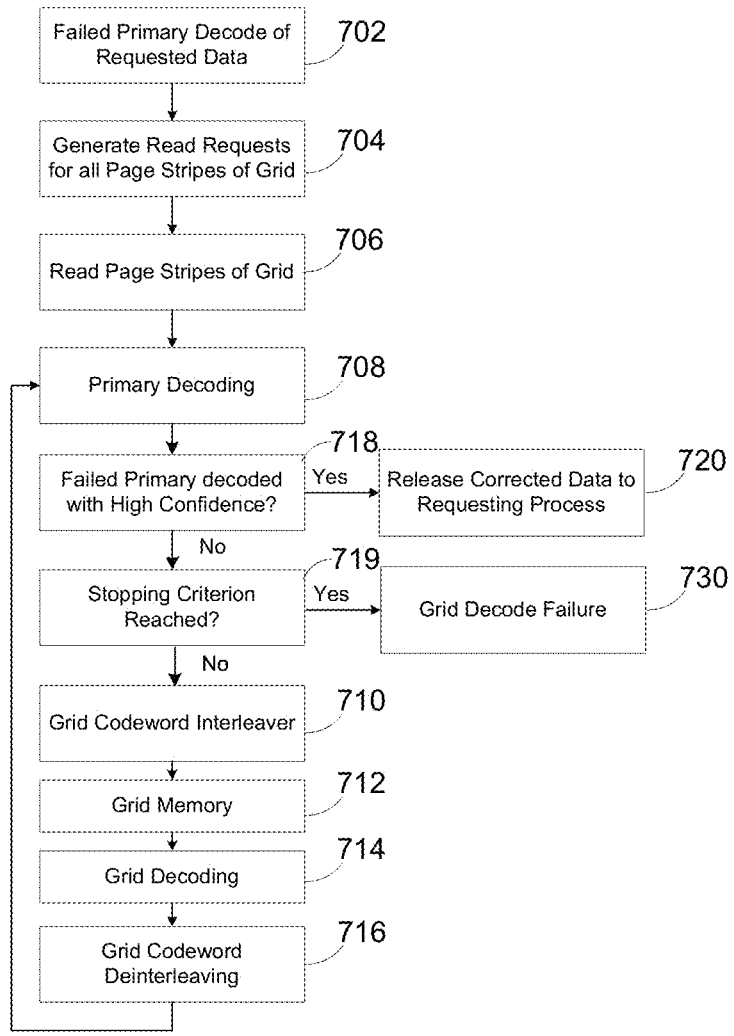
FIG. 7 illustrates a process for decoding a page grid using grid parity.

FIG. 7 illustrates a process for decoding a page grid using grid parity. A grid decoder performs correction on all grid codewords that intersect with a failing primary codeword. Any primary codeword that has corrections made to it is re-decoded with the primary decoder. This operation can proceeds iteratively, according to the established principles of turbo decoding, until the original requested data from 702 is decoded with high confidence, or a stopping criterion such as a maximum number of iterations is reached. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins in a stage 702 due to a failed primary decode, such as from stage 630 of the process of FIG. 6. The process advances from the stage 702 to stages 704, 706, 708 to read each page stripe in the page grid corresponding to the logical block that failed to primary decode properly, except for those with a capacity of zero. Stage 704 generates one entry to block 608 per page stripe in the page grid, while the output of 708 can correspond to 620 (High Confidence) or 630 (Failure). A primary decoder of the ECC encoder/decoder 210 (FIG. 2A) performs ECC correction on each such page stripe, and stores the resulting data into a temporary page grid in the RAM 206 (FIG. 2A). There should be at least one page stripe with a primary codeword that failed to decode properly. The resulting data, whether corrected decoded or not at the primary level, is stored into the temporary grid memory. The process advances from the stage 708 to a stage 718.

In the stage 718, the process evaluates whether the previously failed primary codeword had been corrected with confidence. The criterion discussed earlier in connection with the stage 616 (FIG. 6) can be reused. If the previously failed primary codeword has been corrected with confidence, the process proceeds from the stage 718 to the stage 720 to release the requested the corrected data. Otherwise, the process advances from the stage 718 to a stage 719 to evaluate a stopping criterion. If the stopping criterion has not yet been met, the process proceeds to a stage 710.

In the stage 710, the process performs interleaving to rearrange the page grid data into grid codewords to match the interleaving used when the grid parity had previously been encoded in the stage 516 (FIG. 5). The process advances from the stage 710 to a stage 712. In the stage 712, the grid codewords are temporarily stored in the RAM 206 for grid decoding. The process advances from the stage 712 to a stage 714 in which the ECC encoder/decoder 210 performs decoding of the grid codewords. For example, the decoding can be the decoding of Reed-Solomon codewords. In one embodiment, the grid ECC is a Reed-Solomon with T>16, or in an alternative embodiment, the grid ECC is an LDPC with an embedded CRC check. In one embodiment, the primary LDPC decoder adjusts error likelihood estimations (LLRs) to reflect the outcome of the grid decoding, setting higher confidence on bits which were part of successfully corrected by the grid decoder, and lower confidence on those which were part of uncorrectable grid codewords. Similarly, if the number of symbols in a grid codeword which intersect with failing primary codewords is less than the erasure capability of the grid codeword, the grid decoder can advantageously treat those symbols as erasures. The process advances from the stage 714 to a stage 716.

In the stage 716, the process de-interleaves the corrected block data of the grid codewords to return to the native format of the page grid, which can be maintained in RAM. The previously failed one or more primary codewords can then be readily read from this reconstructed page grid. The process returns from the stage 716 to the stage 708 to perform further primary decoding with the reconstructed page grid. The process can continue to iteratively correct errors in accordance with the principles of turbo decoding until the requested journaling cell(s) have been successfully decoded (stage 720) or a stopping criterion is reached 719, such as the stopping criterion described earlier in connection with the stage 628 (FIG. 6). If the stopping criterion is reached, the process exits with a failure 730.

Figure 8:
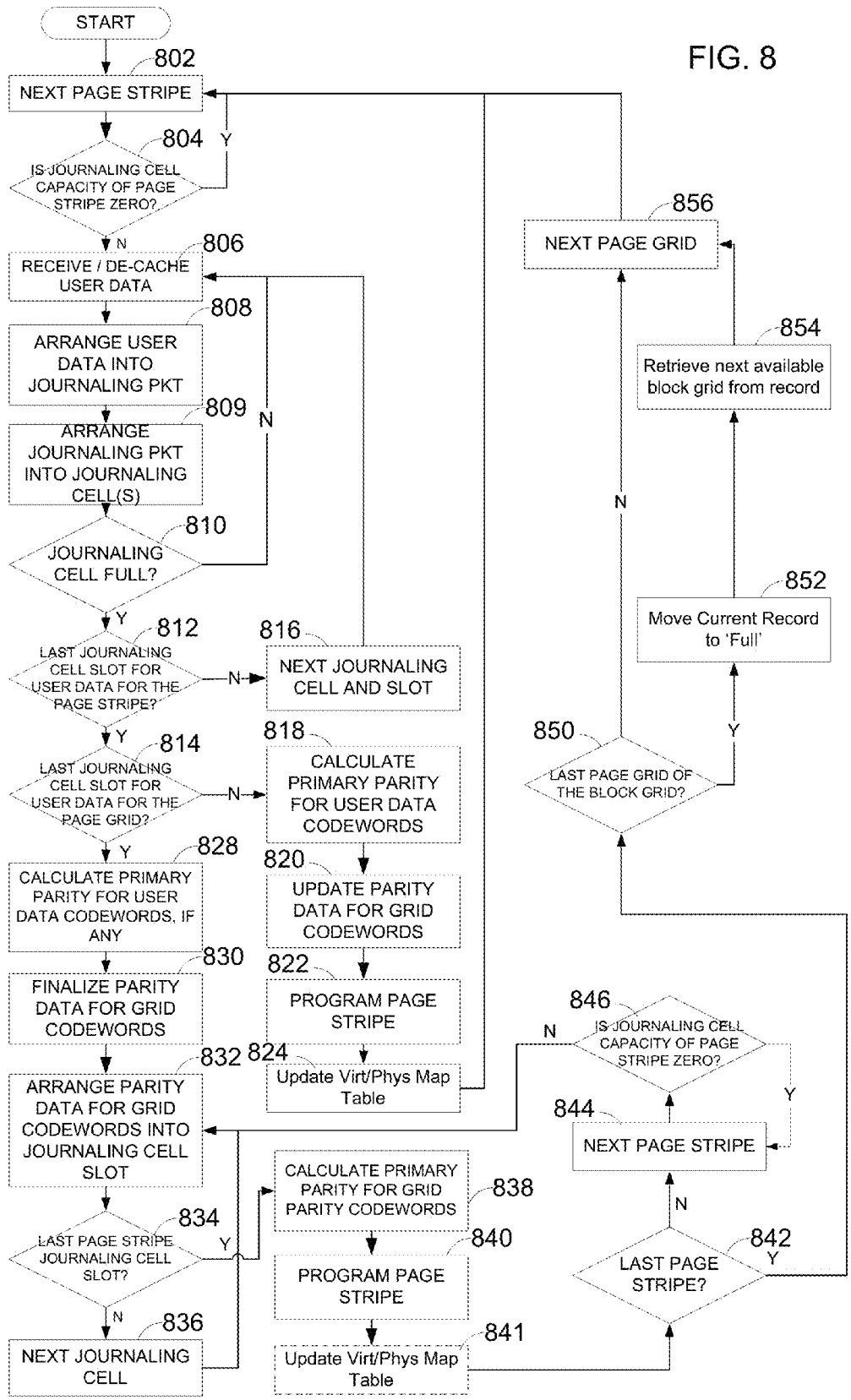
FIG. 8 illustrates an example of storing data.

FIG. 8 illustrates an example of storing data. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins at a stage 802 and retrieves the location of the next page stripe to be written into, which can be correspond to, for example, incrementing a counter for the page stripe number. The page stripe can be maintained in RAM until it is ready to be written to flash. If the journaling cell capacity of the next page stripe is zero 804, that is, the next page stripe is associate with gear zero, a new next page stripe is selected 802/804 until the next page stripe with non-zero journaling cell capacity is found.

User data is received and de-cached as necessary for access 806. In one embodiment, journaling packets are used to arrange 808/809 the data, and a logical block fits into the journaling packet. In one embodiment, the journaling packet is not used. The journaling packet is then arranged into one or more journaling cells. In one example, a journaling packet is split up into two journaling cells. If the journaling cell is not full, the process can return to the stage 806 to receive more data. When the journaling packet is at least as large as the journaling cell, the journaling cell should be full in the stage 810.

In the stage 812, if the journaling cell slot is the last one for user data (last one meaning that there is no more space for other journaling cells of user data), the process advances to the stage 814. Otherwise, the next journaling cell and slot is selected for allocation of data 816 and the process returns to the stage 806.

In the stage 814, the process determines whether or not the current journaling cell slot is the last one for user data within the page grid (last one meaning that there is no more space for other journaling cells of user data). If so, the process advances to from the stage 814 to the stage 828. If not, then it is merely the last one for the a page stripe and the process advances from the stage 814 to the stage 818 to calculate primary parity, to the stage 820 to update grid parity, to the stage 822 to program the page stripe, and to the stage 824 to update any virtual/physical mapping tables, such as a table indicating the mapping of a logical block address to a page grid, page stripe, and journaling cell. The stages 820 and 822 can be interchanged in order or performed in parallel.

In the stage 830, the process finalizes the grid parity, then advances to a stage 832 and iterates through stages 834, 836 to arrange grid parity into journaling cell slots. When the journaling cells for the journaling cell slots are full, the primary parity 838 is calculated over the journaling cells for the grid parity, and the page stripe is programmed 840. If journaling cells containing user data are present in the page stripe, the virtual/physical mapping table can be updated 841.

In a stage 842, the process determines the last page stripe of the page grid has been programmed. If so, the process advances to the stage 850. If not, the process finds the next page stripe via the stage 844, 846 and returns to the stage 832.

In the stages 850, 852, 854, 856, the process determines whether the page grid just programmed is the last page grid of the block grid 850, in which case a new page grid from a new block grid is selected 852, 854. Otherwise, a new page grid from the current block grid can be selected. After the new page grid 856 is selected, the process is reading for programming the next page stripe of the new page grid.

Figure 9:
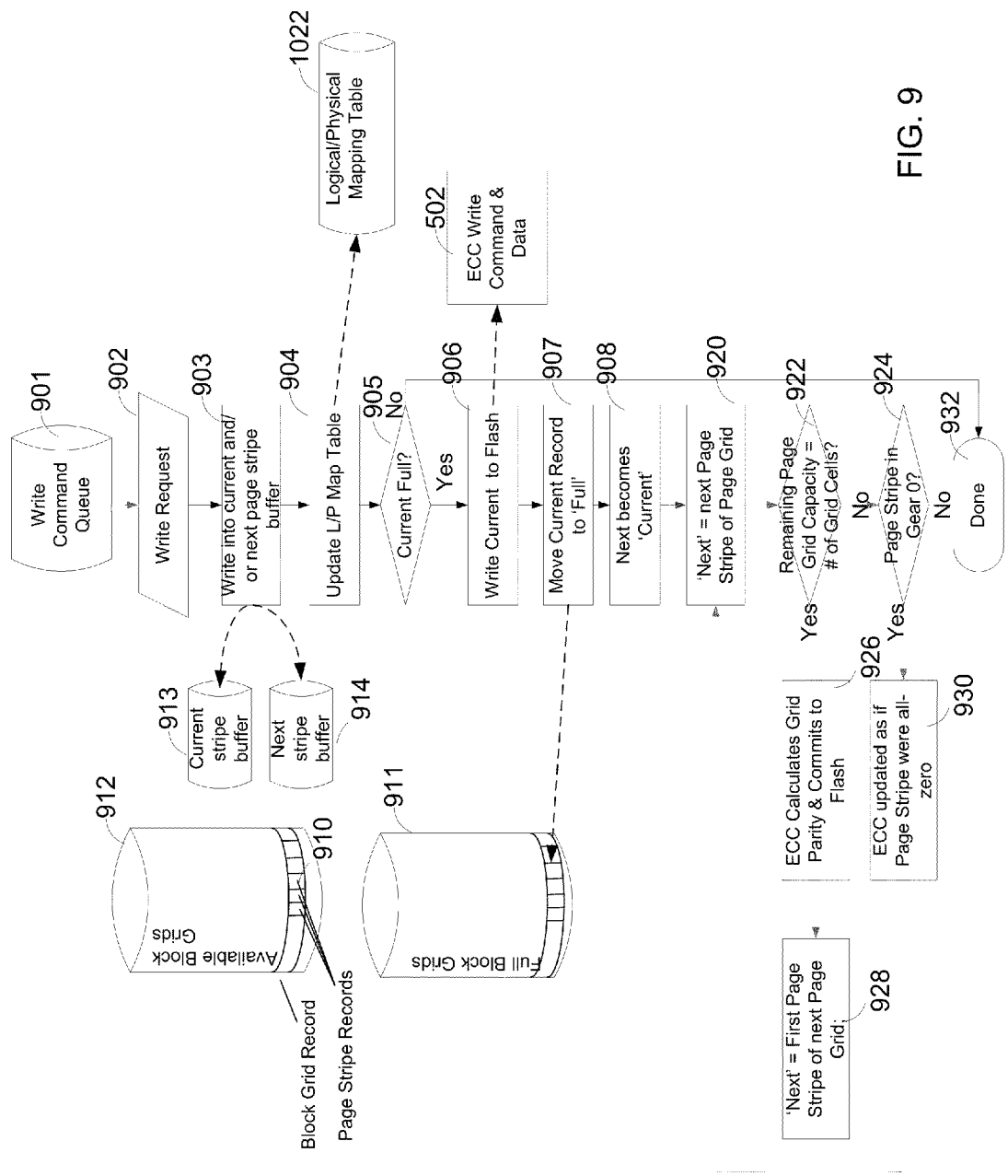
FIG. 9 illustrates a process that the journaling engine can perform to execute write requests.
Figure 10:
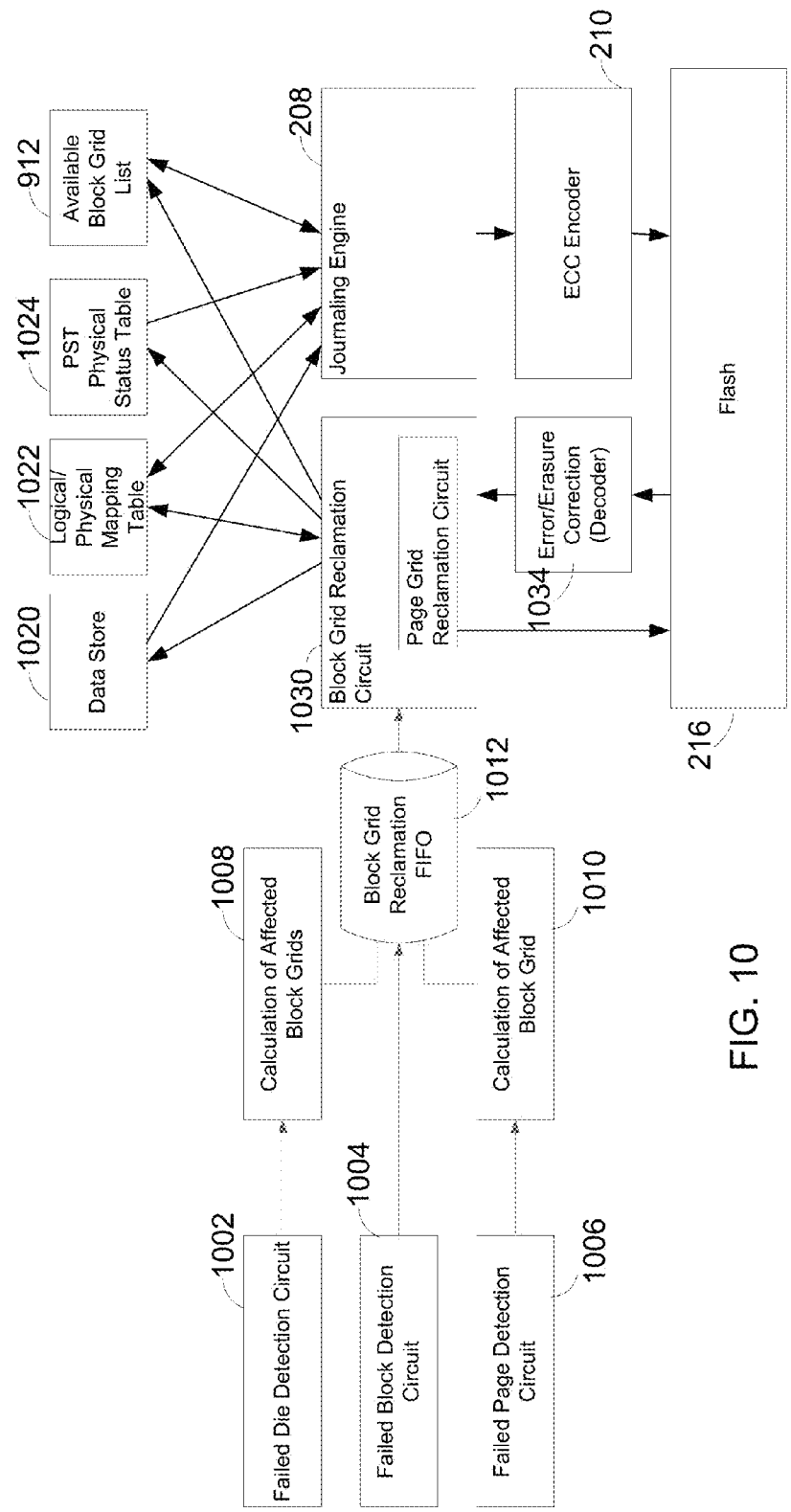
FIG. 10 provides a structural view of the circuitry used during the failure recovery also described in FIG. 13.

FIG. 9 illustrates a process that the journaling engine 208 can perform to execute write requests. FIG. 10 illustrates a data flow diagram of the same. It will be appreciated by the skilled practitioner that the illustrated process can be modified in a variety of ways. For example, in another embodiment, various portions of the illustrated process can be combined, can be rearranged in an alternate sequence, can be removed, or the like.

Whenever a host or other process wishes to write data to a storage array, it supplies the data in a fixed-size allocation block along with a virtual address or logical address that identifies that piece of data, such as a block stripe, which is made up of the blocks that correspond to a page stripe, to that host. These writes are added to a write command queue 901. The journaling engine takes write requests 902 from the write command queue 901. The journaling engine 208 maintains a current page stripe buffer 913 it is journaling into, as well as a next page stripe buffer 914. The payload capacity of each depends on the gear, which is specified in the page stripe record 915. Typically, the payload capacity of a page stripe will be much larger than the size of an allocation block, so that several allocation blocks can be written into a page stripe buffer. At the stage 903, the journaling engine temporarily stores the allocation block in the current page stripe buffer 913, which can be implemented in volatile memory, such as RAM. If the allocation block runs over the end of the page stripe payload, the remaining portion can be assigned to the next available page stripe and temporarily stored in the next available page stripe buffer 914. The journaling engine records the physical location or locations of the data in the virtual (logical) to physical translation table 1204. If the current page stripe is considered to be full 905, then in a stage 906 the journaling engine issues a command 502 to the ECC to encode and write the current page stripe to the flash array. It will be understood that the payload portion of a current page stripe can be considered to be full when it is less than full. For example, if the payload portion of current page stripe is nearly full, such as within a few bytes of being full, the performance of the memory will be improved by not splitting a next allocation block across two different page stripes. When journaling cells are used, it can be desirable not to split a journaling cell across multiple page stripes or page grids. Accordingly, there can be a remaining portion of a page stripe that goes unused when it is considered to be full. If the current page stripe is considered full, or if the remaining journaling cell capacity of the page grid (exclusive of any journaling cell slots reserved for grid parity) is less than 1 full journaling packet, then in a stage 906 the contents of the current stripe buffer are written to flash. The process proceeds to a stage 907. In stage 907, the process moves the record of the current page stripe into the list of full page stripes within the list of full block grids 911. As long as the page grid has capacity for at least one more journaling packet, then in a stage 908, the next page stripe buffer 914 becomes the current page stripe buffer 913. In Stage 920, the process assigns the subsequent page stripe within the page grid to be the "Next Stripe" which will receive the data stored in the Next Stripe Buffer 914. The capacity of the assigned page stripe is recorded, not including any journaling cell slots allocated to grid parity. If that subsequent page stripe has a capacity of zero journaling cells as determined in Stage 924, then it is skipped; otherwise the process is complete (932) until the next Write Request (902) arrives.

If, after stage 907, the remaining page grid capacity is less than one journaling packet, exclusive of cell slots reserved for grid parity, the page grid is considered to be full. In a stage 926, grid parity is calculated and stored as described earlier in connection with FIG. 8. It is readily understood that, in practice, calculation of the grid ECC is done incrementally as the data passes through, with the partial result stored in a local buffer. The process advances to stages 928-929, in which the first two page stripe of a next Page Grid is selected, skipping any which have a capacity of zero journaling cells. The process advances to a stage 932, in which it waits for an additional write request 902 to arrive.

Once the stage 932 is reached, the write request is complete. During writes, the journaling engine 208 also checks in the stage 904 to see if there is existing data in the storage array corresponding to the virtual address being overwritten by the operation. If so, it marks the physical address for the previous data as "invalid," as flash cannot be overwritten.

Figure 11:
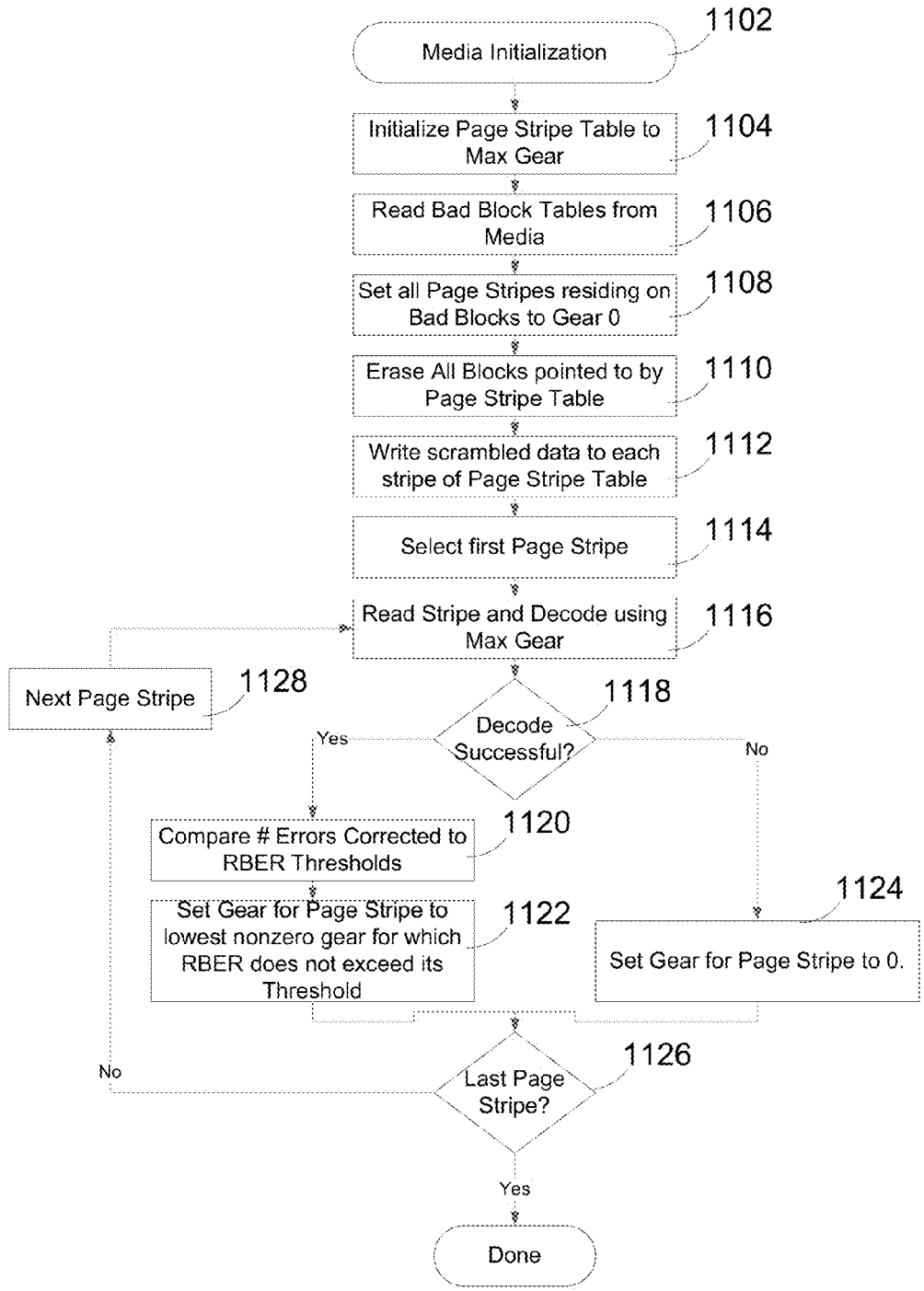
FIG. 11 illustrates a process of initialization.

FIG. 10 will be discussed later in connection with FIG. 13. FIG. 11 illustrates a process of initialization. It will be appreciated by the skilled practitioner that the illustrated process can be modified in a variety of ways. For example, in another embodiment, various portions of the illustrated process can be combined, can be rearranged in an alternate sequence, can be removed, or the like.

In stage 1102, it is desired that part or all of a set of storage media be initialized and made ready for use. Advantageously, this process can make use of the gear structures and ECC blocks described earlier in connection with FIGS. 5 and 6, and elsewhere in this disclosure. In a stage 1104, page stripes are initialized to the gear with the greatest error correction capacity. The process advances to a stage 1106. In a stage 1106, a bad block table is read from the media location specified by the manufacturer. The process advances to a stage 1106. Optionally, in a stage 1108, all page stripes that intersect with bad blocks are set to a capacity of zero. The process advances to a stage 1110, in which all blocks to be initialized are erased.

Next, in a stage 1112, each page stripe is programmed with journaling cells containing pseudorandom test data, such as the output of a scrambler, protected by the ECC selected in Stage 1104. In a stage 1114, the first page stripe in the storage medium is selected. In a stage 1116, that page stripe is read, and decoded according to the ECC gear selected in stage 1104. If the decode is successful, then the data integrity status of the media is estimated in a step 1120, based at least on the number of bits corrected, optionally along with other information such as the number of processing steps required to decode. Based at least on this information, in a stage 1122, the page stripe is assigned the highest-code-rate gear for which the predefined thresholds are met.

If the decode was not successful, then the process advances to a stage 1124 in which the page stripe is assigned a capacity of zero (Gear 0). The process starting at 1116 is repeated for every page stripe of every page grid of the media region being initialized.

Figure 12:
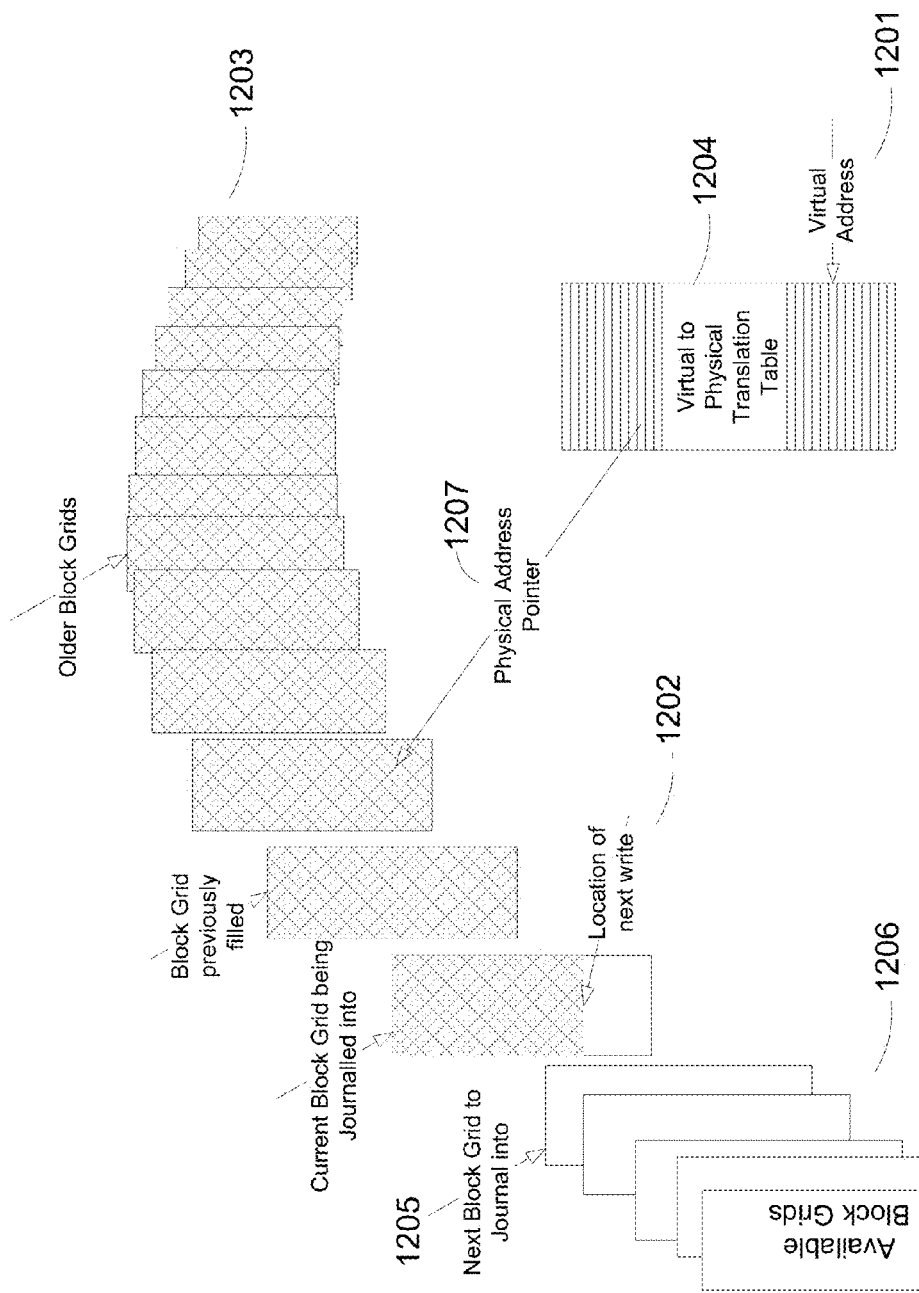
FIG. 12 illustrates the operation of a virtual/physical translation table, which is used by the journaling engine.

FIG. 12 illustrates the operation of a virtual/physical translation table, which is used by the journaling engine 208 (FIG. 2A). It will be appreciated by the skilled practitioner that the illustrated process can be modified in a variety of ways. For example, in another embodiment, various portions of the illustrated process can be combined, can be rearranged in an alternate sequence, can be removed, or the like.

Whenever a host wishes to write data to a storage array, the host supplies the data in a fixed-size allocation block along with a virtual address 1201 that identifies that piece of data to the host. The journaling engine 208 finds an empty region for a write location 1202 to the storage array, and issues commands for the data to be written to that area. The journaling engine 208 updates the virtual to physical translation table 1204 with the physical address or addresses 1207 corresponding to the virtual address 1201. If the virtual address was previously mapped to a physical address in a full block 1203, that physical address is marked as "invalid." The pointer to the next valid write location 1202 is advanced. When the pointer reaches the end of the current block grid, the pointer is advanced to the next block grid 1205. The journaling engine 208 maintains a supply of available blocks 1206 by erasing and reclaiming blocks, an example of which was described in connection with FIG. 16 of related application Ser. No. 13/477,845 filed on May 22, 2012, which is incorporated by reference herein.

Determining the Failure of a Flash Region

Figure 13:
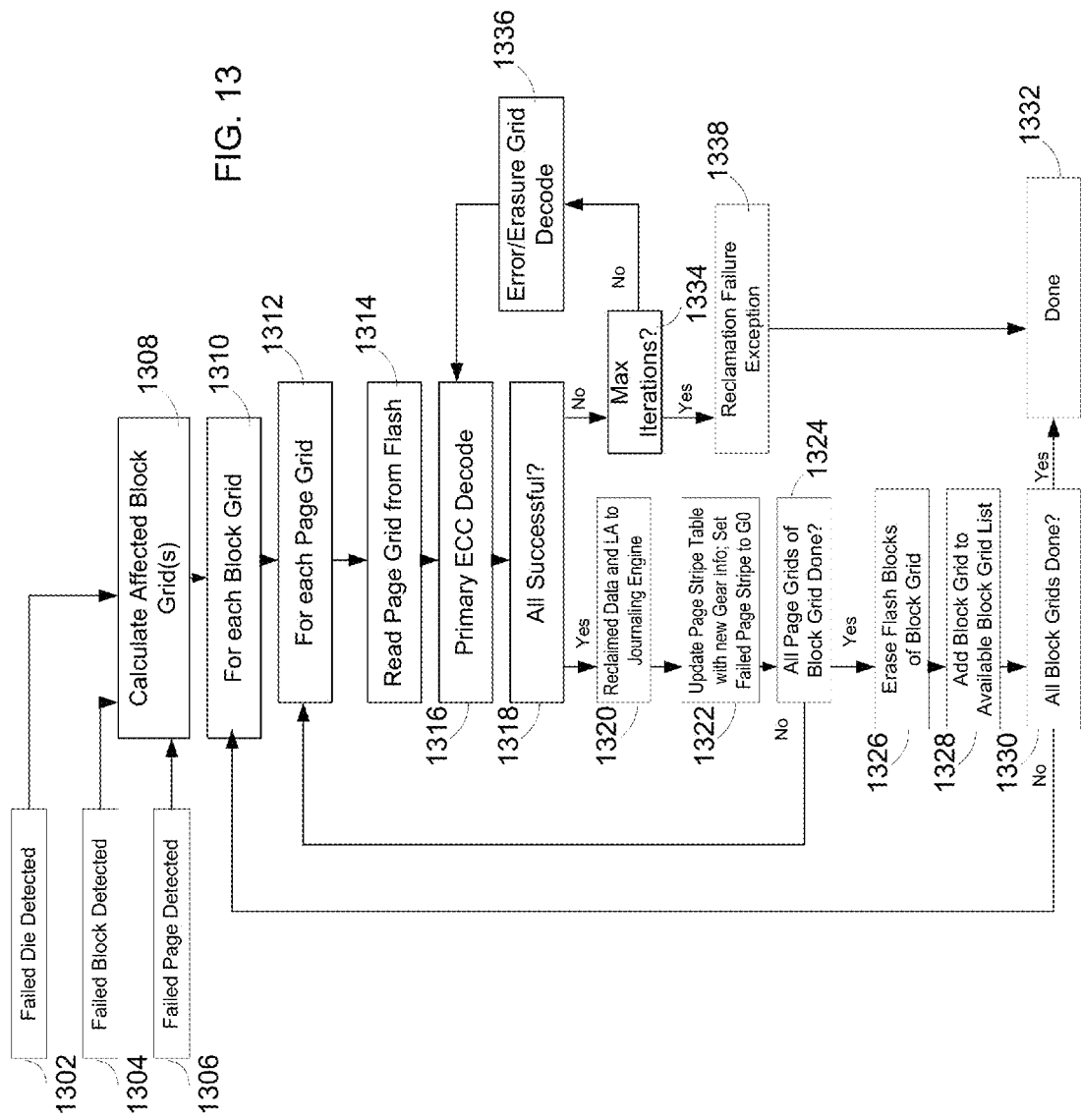
FIG. 13 illustrates a process for failure recovery.

FIG. 13 illustrates a process for failure recovery. It will be appreciated by the skilled practitioner that the illustrated process can be modified in a variety of ways. For example, in another embodiment, various portions of the illustrated process can be combined, can be rearranged in an alternate sequence, can be removed, or the like. The illustrated process is described in further detail in connection with FIG. 10, which follows this description of FIG. 13.

Determination of the failure of a flash die, plane, or block can be a firmware function that finds correlation between failures reported by the primary ECC on multiple page stripes having a common block, plane, or die address. Particular error signatures may be used to assist in the identification, such as a relatively high proportion of ECC codewords failing, a relatively high proportion of LDPC parity nodes failing, all-zeroes patterns, or all-ones patterns. Such patterns tend to be inconsistent with normal random errors being the cause of an uncorrectable codeword.

When a flash die is determined to have failed, the block grids that intersect that die should be scheduled for reclamation on a priority basis.

Each block grid comprises a number of page grids and are related to the page grids in the manner that a block is related to pages. In flash memory, a block comprises the smallest eraseable unit. Data is read from each page grid in the normal way, and valid data is journaled into available page grids. Gear settings for non-failed page grids are updated as normal.

The page stripe on the failed die is treated as an erasure according to the known principles of erasure decoding, and grid parity is used to rebuild its contents, as well as to fix any uncorrectable primary codewords in non-failed page stripes. The valid parts of the rebuilt data are journaled into available page stripes.

The gear setting for the page stripe on the failed die is set to zero, and the remaining capacity of the page grid is calculated. If this capacity is below a predetermined threshold, the page grid as a whole may be removed from use.

Once all valid data on all page stripes of the block grid have been journaled into new locations on the flash, and all gear updates have been made, the blocks of the block grid are erased. The block grid, with updated gears, is returned to the list of available block grids. The next time it is used, all stripes on the failed die will have size zero, and therefore by definition are error-free. The full recovery capability of the grid will be available for subsequent failures.

Recovering from the Failure of a Flash Plane, Block, or Page

If one or more planes on a flash die is determined to have failed, then the procedure for a failed die should be followed for each page grid that intersects a failed plane.

If one or more blocks on a flash die is determined to have failed, then the procedure for a failed die should be followed for each page grid that intersects a failed block.

If one or more pages on a flash die is determined to have failed, then the next time the page grid is reclaimed, the page stripe containing that page must be given a capacity of 0.

FIG. 10 provides a structural view of the circuitry used during the failure recovery described in FIG. 13. When a Failed Die Detection Circuit 1002 indicates a die has failed, a process 1008 calculates the index of affected block grids.

These go into a the FIFO for reclamation of Block Grids 1012, which may be a high priority queue similar to one used in normal reclamation ('Garbage Collection'). Alternately, if a circuit determines an individual block has failed (1004) then only one block grid will be affected; that block grid index enters the FIFO 1012. Similarly, if a particular page is determined to have failed, then the index one block grid containing the failed page will enter the FIFO 1012.

A Block Grid Reclamation Circuit 1030, which may also perform normal reclamation ('Garbage Collection') recovers the contents of each Page Grid of the Block Grid, using a procedure described in FIG. 6. In one implementation, Page Stripe Read Requests 608 are used, at least for failed page stripe(s). The error/erasure decoder 1034 performs correction operations including operations described earlier in connection with FIGS. 6 and 7.

The Block Grid Reclamation Circuit 1030 makes use of a data store 1020 to hold any valid journaling packets that need to be stored into new locations. It makes use of the Logical/Physical Mapping Table 1022 at least to determine which journaling packets are valid. It makes use of the Physical Status Table 1024 at least to determine the gear of page stripes to be read, and updates it based on statistics captured during decoding. It sets failed page stripes to Gear 0, and recalculates the capacity of each page grid.

The journaling engine 208 allocates reclaimed valid journaling packets from 1020 into new locations using procedures described earlier in connection with FIG. 8 and FIG. 9. It selects new locations from the list of Available Block Grids, Page Grids, and Page Stripes 912. It updates the Logical/Physical Mapping Table 1022 with the new locations of these journaling packets. Once all valid data from a Block Grid has been committed to a new location, the Block Grid Reclamation Circuit erases the media associated with the Block Grid, and returns the Block Grid to the Available Block Grid List 912. Advantageously, even block grids containing multiple failed dies, blocks, or pages can continue to be used normally, except for the affected page stripes being set to a capacity of zero.

Figure 14:
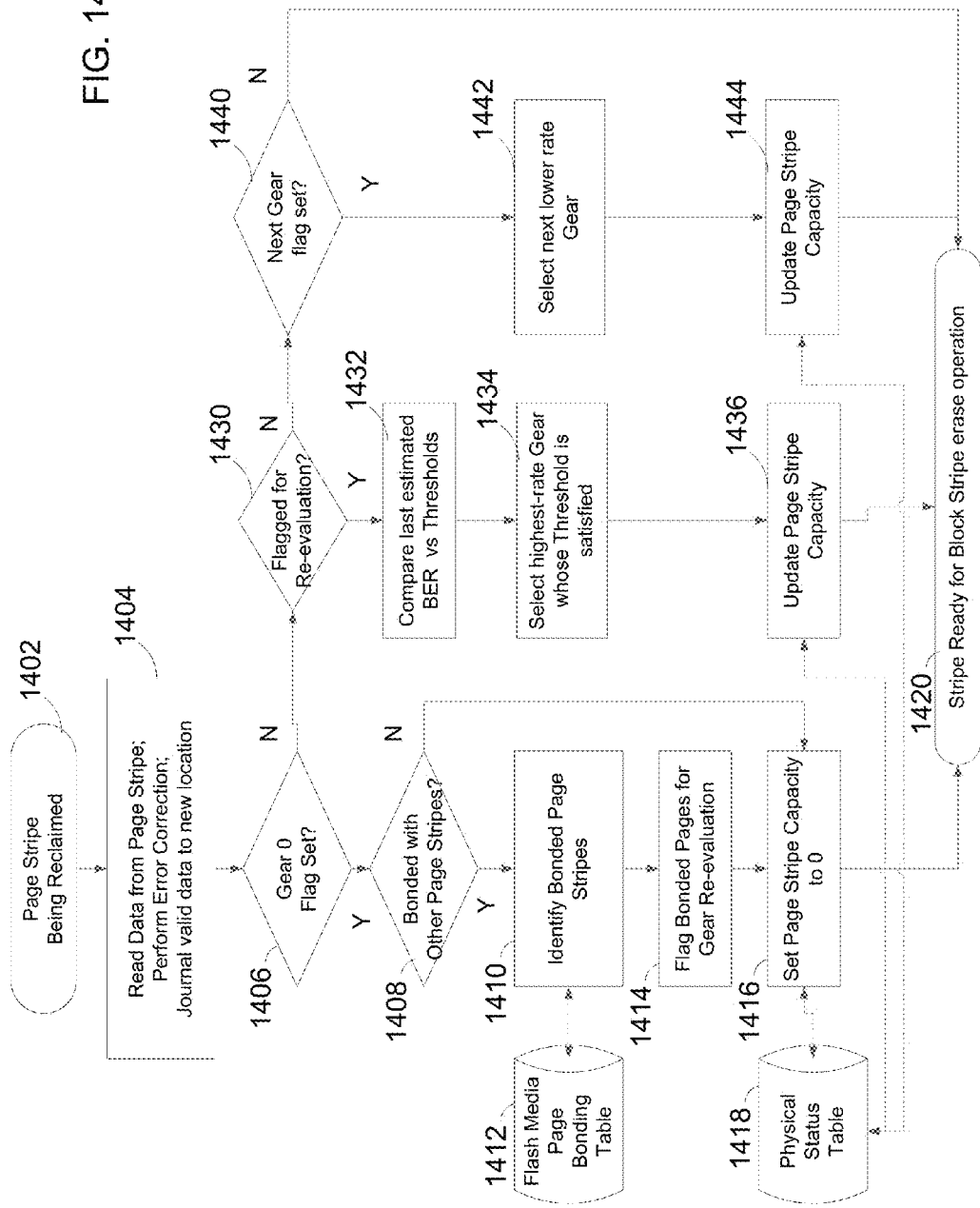
FIG. 14 illustrates a process for re-evaluation.

FIG. 14 illustrates a process for re-evaluation. It will be appreciated by the skilled practitioner that the illustrated process can be modified in a variety of ways. For example, in another embodiment, various portions of the illustrated process can be combined, can be rearranged in an alternate sequence, can be removed, or the like.

The process starts at step 1402, in which a page stripe is being reclaimed. The reclamation process proceeds in 1404, wherein any valid data on the stripe is read, error correction is performed, (possibly including grid decoding), and the corrected valid data is journaled to a new location. Based at least on the outcome of 1404 or on information previously stored in a Physical Status Table 1418, a decision is made in step 1406 whether the page must be retired (such as by setting its capacity to 0). If so, then if (1408) the flash media is MLC such that the page stripe is bonded with other page stripe(s), then in step 1410 the bonded pages are determined based on the stored, manufacturer-supplied bonding table for that flash media. In step 1414 page stripes identified in page 1410 are flagged for gear re-evaluation in a local memory. At stage 1416, the page stripe capacity is set to 0, and the page stripe is ready to be erased, pending the rest of the block stripe being similarly ready. Page stripes which, at stage 1408, have no bonded pages can skip directly to step 1416.

Subsequently, when the bonded page stripes are reclaimed (1402, 1404) then as long as they are not also retired (1406) then their flag for re-evaluation will be observed at step 1430.

Page stripes flagged for re-evaluation at step 1430 go to a step 1432, in which their data integrity status is re-evaluated de novo in a step 1432, based at least on the number of bits corrected, optionally along with other information such as the number of processing steps required to decode. Based at least on this information, in a stage 1434, the page stripe is assigned the highest-code-rate gear for which the predefined thresholds are met. In a step 1436, at least a Physical Status Table may be updated based on the new, potentially higher-capacity gear. The page stripe can then be ready to be erased (1420), pending the rest of the block stripe being similarly ready.

Page stripes that are not flagged for Gear 0 (1406) or re-evaluation (1430) are checked to see if a previous process has marked them for an increase in gear, for increased ECC protection at the cost of a lower journaling cell capacity. If so, then the physical status table is updated with the next lower gear (1442, 1444) and the page stripe can be ready to be erased (1420), pending the rest of the block stripe being similarly ready.

Reclaimed page stripes with no changes flagged can be ready to be erased (1420), pending the rest of the block stripe being similarly ready.

Figure 15:
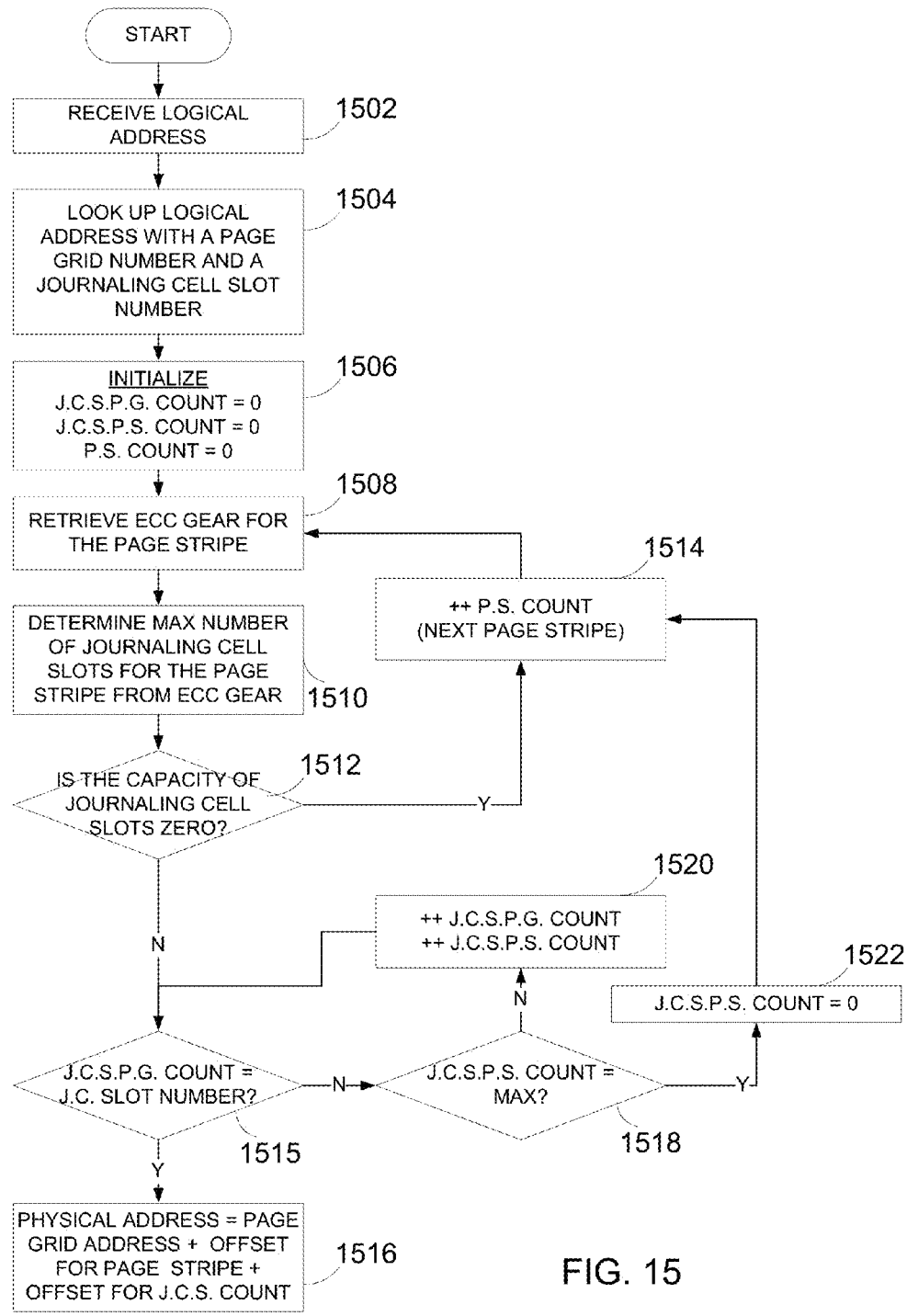
FIG. 15 illustrates an example of logical-to-physical mapping.

FIG. 15 illustrates an example of logical to physical mapping. It will be appreciated by the skilled practitioner that the illustrated process can be modified in a variety of ways. For example, in another embodiment, various portions of the illustrated process can be combined, can be rearranged in an alternate sequence, can be removed, or the like. The illustrated process can be used to locate a physical address for a journaling cell slot for a read operation. For a write operation, the physical address can be updated using a pointer.

In the embodiments illustrated earlier, a lookup table included enough information to retrieve the journaling cell slot's physical address. For example, the lookup table can include the page grid number (if there is more than one page grid), the page stripe number, and a journaling cell slot number. These numbers can be associated with address offsets. However, if it is desired to keep the size of the lookup table smaller, for example, the page stripe number does not need to be stored in the lookup table.

In the stages 1502, 1504, the process receives a logical address, such as a logical block address, and retrieves a page grid address and a journaling cell slot number. If journaling packets are used and there are more than one journaling cell slots used to store a journaling packet, the journaling cell slot number can correspond to the first journaling cell slot that is used to store the journaling packet. In the stage 1506, the process initializes to zero, counts of variables for a journaling cell slot relative to the page grid (j.c.s.p.g.), journaling cell slot relative to the page stripe (j.c.s.p.s.), and a page stripe (p.s.). The value of 0 can indicate the first of each, for example, the first journaling cell slot can have a count of 0.

The process retrieves the gear 1508 for the current page stripe, and the process determines the maximum number 1510 of journaling cell slots in the current page stripe based on the gear. If gear zero is indicated, the process proceeds from the stage 1512 to a stage 1514, in which the process increments the page stripe counter and returns to the stage 1508. If gear zero is not indicated, the process proceeds from the stage 1512 to a stage 1515.

In the stage 1515, the process determines whether the variable j.c.s.p.g. matches with the journaling cell slot number from the lookup table. If so, the physical address can be determined by combining 1516 the various offsets based on the page grid address, page stripe offset, and the journaling cell offset based on their respective counts. Otherwise, the process proceeds from the stage 1515 to a stage 1518.

The variable j.c.s.p.s. holds the journaling cell slot number within the current page stripe. If the variable j.c.s.p.s. matches the maximum value from the stage 1512, the process clears 1522 the j.c.s.p.s. to zero, increments 1514 the page stripe counter, and returns to the stage 1508 to evaluate the next page stripe. If the variable j.c.s.p.s. has not reached its maximum value, the process proceeds from the stage 1518 to a stage 1520 in which the process increments both the j.c.s.p.g. and the j.c.s.p.s. counts and returns to the stage 1515.

Reevaluation of Page Stripes when a Related Page is Retired

In multi-level cell flash, two or more bits of information are stored in the same physical flash cell, by means of multi-level coding. Typical arrangements are four levels encoding 2 bits per cell (called MLC-2, or simply MLC) and eight levels encoding 3 bits per cell (called MLC-3, or TLC). Typically, the flash is structured and programmed so that each of the bits encoded to a given physical flash cell is addressed with the same bit index, but a different predetermined page index. Thus each page index may have other related page index(es) which address the other bits of the physical cells it maps to.

Programming the related pages (and thus the constituent related bits) of a page 'Px' can have the effect of increasing the characteristic BER observed on Px. Conversely, if a related page or pages are not programmed (or, alternately, programmed with a fixed pattern) then the characteristic BER can go down.

Therefore, in the context of an adaptive, multi-rate ECC scheme as disclosed herein, whenever a pages is retired (such as by setting its capacity of zero) it can be useful to re-evaluate the ECC requirements of the bonded page stripes, and possibly reduce the ECC requirements in favor of increased capacity.

Extensions and Variations

The choice of page stripes being four lanes wide is a balanced and convenient choice. However, page stripes of other widths for example, as narrow as one page or as wide as 16 pages, are also applicable. Arranging the flash pages on four parallel lanes provides good latency for partial reads, and efficient sharing of the flash interface. However, the principles and advantages described herein are still applicable if the page stripe is distributed over many dice on the same lane, on a random selection of four lanes within a large multi-lane access system, or any combination thereof.

Reading a minimum amount from the flash memory necessary to decode the user-requested part of the page stripe, and doing a follow-up read of the entire page stripe when required is one approach. Another approach that also works is to transfer the entire page stripe during the initial read, starting with that initial minimal set, but continuing on to read the remainder rest of the page stripe, and wrapping around to the beginning of the page stripe, and continuing on until the entire page stripe is available. In parallel, the initial ECC decode operation is performed. If the quick-release ECC is successful, the transfer of the remaining bytes of the stripe can be aborted. If the quick-release is not successful, then the decoder can wait until the rest of the page stripe is available, and completes the decode operation.

The principles and advantages disclosed herein are applicable to flash drives that emulate hard disk drives. Various forms of flash drives include, but are not limited to: solid-state drives (whether SCSI, SATA, or PCI attached), solid-state caching or tiering devices, enterprise flash drives, hybrid drives (hybrids of hard disk drives and flash drives), flash memory cards, flash memory sticks, thumb drives, backup drives, or the like. For example, various aspects can be incorporated into a solid-state drive controller chip. Alternatively, various aspects can be incorporated with the host, such as, by being incorporated into the same motherboard with other components of the host. A flash translation layer permits a flash drive to emulate a hard disk drive by transferring data to and from the host in allocation blocks. The host can use any of many different file systems, such as, but not limited to: New Technology File System (NTFS), File Allocation Table (FAT), FAT32, High Performance File System (HPFS), Ext2, Ext3, Ext4, Hierarchical File System (HFS), HFS Plus (HFS+), or the like. The host or host computer can be, for example, but not limited to, an enterprise server, a web server, a mobile base station, a host bus adapter, an IP router, a home server, a file server, a workstation, a data logger, a digital video recorder, a smart TV, a media center, a jukebox, a smart phone, a mobile phone, a personal digital assistant, a personal computer, a laptop computer, a tablet computer, a video gaming console, an interactive kiosk, a digital camera, a digital video camera, a digital music player, an ebook reader, or the like.

Various embodiments have been described above. Although described with reference to these specific embodiments, the descriptions are intended to be illustrative and are not intended to be limiting. Various modifications and applications may occur to those skilled in the art.

What is claimed is:

1. An electronically-implemented method of adapting to changing characteristics of multi-level flash cells, the method comprising:

storing data in pages of a memory device having multi-level cells, wherein two or more bonded pages share a set of multi-level cells, wherein a multi-level cell is configured to store a first bit for a first page and a second bit for a second page of the bonded pages;

arranging the pages of the memory device into a plurality of page stripes for storage of data, wherein page stripes individually comprise one or more pages or integer fractions thereof, wherein the bonded pages belong to separate page stripes such that a first page stripe and a second page stripe of a bonded page stripe are related by having bonded pages of memory that share multi-level cells, wherein an ECC characteristic is selected for a page stripe and is applicable to the one or more pages or integer fractions thereof of the page stripe, wherein the plurality of page stripes include at least a third page stripe associated with a first gear such that the third page stripe has a first non-zero integer journaling cell slot capacity for data and a first capacity for parity bits of a first error correction code protective of data stored within the first page stripe and a fourth page stripe associated with a second gear such that the fourth page stripe has a second non-zero integer journaling cell slot capacity different from the first non-zero journaling slot capacity and a second capacity for parity bits of the first error correction code protective of data stored within the second page stripe;

using the first page stripe and the second page stripe of the bonded page stripe to store data;

determining a first estimated bit error rate (first BER) for the first page stripe and a second estimated bit error rate (second BER) for the second page stripe during field use of the memory device, wherein none of the first page stripe or the second page stripe is associated with gear zero at the time of determining the first BER and the second BER, wherein gear zero corresponds to a zero journaling cell slot capacity; and when at least one of the first BER or the second BER exceeds a first predetermined threshold, associating gear zero with a selected one of the first page stripe or the second page stripe.

2. The method of claim 1, wherein the second page stripe corresponds to the selected one of the first page stripe or the second page stripe for association with gear zero, the method further comprising:
performing a data integrity test on the first page stripe to determine a new estimated bit error rate after the association with gear zero for the second page stripe; and
selecting from at least the first gear, the second gear, or gear zero for association with the first page stripe based on the new estimated bit error rate.

3. The method of claim 2, further comprising increasing a journaling cell slot capacity of the first page stripe over a previously assigned journaling cell slot capacity.

4. The method of claim 2, wherein performing the data integrity test comprises retaining a previous gear setting for the first page stripe and monitoring a number of bit errors corrected on the first page stripe during field use.

5. The method of claim 1, wherein when at least one of the first BER or the second BER exceeds the first predetermined threshold, the method further comprises selecting the first page stripe or the second page stripe having the worse estimated bit error rate for association with gear zero.

6. The method of claim 1, wherein page stripes individually comprise four or more pages.

7. An electronically-implemented method of selecting an error correction code (ECC) characteristic, the method comprising:
storing data in pages of a memory device having multi-level cells, wherein two or more bonded pages share a set of physical cells, wherein a multi-level cell is configured to store a first bit for a first page, a second bit for a second page, and a third bit for a third page of the bonded pages;
arranging the pages of the memory device into a plurality of page stripes for storage of data,
wherein page stripes individually comprise one or more pages or integer fractions thereof,
wherein the bonded pages belong to separate page stripes such that a first page stripe, a second page stripe, and a third page stripe of a bonded page stripe are related by having bonded pages of memory that share multi-level cells,
wherein an ECC characteristic is selected for a page stripe and is applicable to the pages of the page stripe,
wherein the plurality of page stripes include at least a fourth page stripe associated with a first gear such that the fourth page stripe has a first non-zero integer journaling cell slot capacity for data and a first capacity for parity bits of a first error correction code protective of data stored within the first page stripe, and a fifth page stripe associated with a second gear such that the second page stripe has a second non-zero integer journaling cell slot capacity different from the first non-zero journaling slot capacity and a second capacity for parity bits of the first error correction code protective of data stored within the second page stripe;
using the first page stripe, the second page stripe, and the third page stripe of the bonded page stripe to store data;
determining a first estimated bit error rate (first BER) for the first page stripe, a second estimated bit error rate (second BER) for the second page stripe, and a third estimated bit error rate (third BER) for the third page stripe during field use of the memory device, wherein none of the first page stripe, the second page stripe, or the third page stripe is associated with gear zero at the time of determining the first BER, the second BER, and the third BER, wherein gear zero corresponds to a zero journaling cell slot capacity; and
when at least one of the first BER, the second BER, or the third BER exceeds a first predetermined threshold, associating gear zero with a selected one of the first page stripe, the second page stripe, or the third page stripe.

8. The method of claim 1, wherein when at least one of the first BER, the second BER, or the third BER exceeds the first predetermined threshold, the method further comprises selecting the first page stripe, the second page stripe, or the third page stripe having the worst bit error rate for association with gear zero.

9. The method of claim 1, wherein the third page stripe corresponds to the selected one of the first page stripe, the second page stripe, or the third page stripe, for association with gear zero, the method further comprising:
performing a data integrity test on the first page stripe to determine a fourth estimated bit error rate (fourth BER) for the first page stripe and on the second page stripe to determine a fifth estimated bit error rate (fifth BER) for the second page stripe after the association with gear zero for the third page stripe;
selecting from at least the first gear, the second gear, or gear zero for association with the first page stripe based on the fourth BER; and
selecting from at least the first gear, the second gear, or gear zero for association with the second page stripe based on the fifth BER.

10. The method of claim 9, wherein when at least one of the fourth BER or the fifth BER exceeds the second predetermined threshold, the method further comprises selecting the first page stripe or the second page stripe having the worse estimated bit error rate for association with gear zero.

11. An apparatus comprising:
a journaling engine configured to:
store data in pages of a memory device having multi-level cells, wherein two or more bonded pages share a set of multi-level cells, wherein a multi-level cell is configured to store a first bit for a first page and a second bit for a second page of the bonded pages;
arrange the pages of the memory device into a plurality of page stripes for storage of data,
wherein page stripes individually comprise one or more pages or integer fractions thereof,
wherein the bonded pages belong to separate page stripes such that a first page stripe and a second page stripe of a bonded page stripe are related by having bonded pages of memory that share multi-level cells,
wherein an error correction code (ECC) characteristic is selected for a page stripe and is applicable to the one or more pages or integer fractions thereof of the page stripe,
wherein the plurality of page stripes include at least a third page stripe associated with a first gear such that the third page stripe has a first non-zero integer journaling cell slot capacity for data and a first capacity for parity bits of a first error correction code protective of data stored within the first page stripe and a fourth page stripe associated with a second gear such that the fourth page stripe has a second non-zero integer journaling cell slot capacity different from the first non-zero journaling slot capacity and a second capacity for parity bits of the first error correction code protective of data stored within the second page stripe;
use the first page stripe and the second page stripe of the bonded page stripe to store data; and
an ECC encoder/decoder configured to:
determine a first estimated bit error rate (first BER) for the first page stripe and a second estimated bit error rate (second BER) for the second page stripe during field use of the memory device, wherein none of the first page stripe or the second page stripe is associated with gear zero at the time of determining the first BER and the second BER, wherein gear zero corresponds to a zero journaling cell slot capacity; and
when at least one of the first BER or the second BER exceeds a first predetermined threshold, associate gear zero with a selected one of the first page stripe or the second page stripe.

12. The apparatus of claim 11, wherein the second page stripe corresponds to the selected one of the first page stripe or the second page stripe for association with gear zero, wherein the ECC encoder/decoder is further configured to:
perform a data integrity test on the first page stripe to determine a new estimated bit error rate after the association with gear zero for the second page stripe; and
select from at least the first gear, the second gear, or gear zero for association with the first page stripe based on the new estimated bit error rate.

13. The apparatus of claim 12, wherein the ECC encoder/decoder is further configured to increase a journaling cell slot capacity of the first page stripe over a previously assigned journaling cell slot capacity.

14. The apparatus of claim 12, wherein to perform the data integrity test, the ECC encoder/decoder is further configured to retain a previous gear setting for the first page stripe and monitor a number of bit errors corrected on the first page stripe during field use.

15. The apparatus of claim 11, wherein when at least one of the first BER or the second BER exceeds the first predetermined threshold, the ECC encoder/decoder is further configured to select the first page stripe or the second page stripe having the worse estimated bit error rate for association with gear zero.

16. The apparatus of claim 11, wherein page stripes individually comprise four or more pages.

17. An apparatus comprising:
a journaling engine configured to:
store data in pages of a memory device having multi-level cells, wherein two or more bonded pages share a set of physical cells, wherein a multi-level cell is configured to store a first bit for a first page, a second bit for a second page, and a third bit for a third page of the bonded pages;
arrange the pages of the memory device into a plurality of page stripes for storage of data,
wherein page stripes individually comprise one or more pages or integer fractions thereof,
wherein the bonded pages belong to separate page stripes such that a first page stripe, a second page stripe, and a third page stripe of a bonded page stripe are related by having bonded pages of memory that share multi-level cells,
wherein an error correction code (ECC) characteristic is selected for a page stripe and is applicable to the pages of the page stripe,
wherein the plurality of page stripes include at least a fourth page stripe associated with a first gear such that the fourth page stripe has a first non-zero integer journaling cell slot capacity for data and a first capacity for parity bits of a first error correction code protective of data stored within the first page stripe, and a fifth page stripe associated with a second gear such that the second page stripe has a second non-zero integer journaling cell slot capacity different from the first non-zero journaling slot capacity and a second capacity for parity bits of the first error correction code protective of data stored within the second page stripe;
use the first page stripe, the second page stripe, and the third page stripe of the bonded page stripe to store data;
a first circuit configured to determine a first estimated bit error rate (first BER) for the first page stripe, a second estimated bit error rate (second BER) for the second page stripe, and a third estimated bit error rate (third BER) for the third page stripe during field use of the memory device, wherein none of the first page stripe, the second page stripe, or the third page stripe is associated with gear zero at the time of determining the first BER, the second BER, and the third BER, wherein gear zero corresponds to a zero journaling cell slot capacity; and
a second circuit configured to associate gear zero with a selected one of the first page stripe, the second page stripe, or the third page stripe when at least one of the first BER, the second BER, or the third BER exceeds a first predetermined threshold.

18. The apparatus of claim 11, wherein when at least one of the first BER, the second BER, or the third BER exceeds the first predetermined threshold, the ECC encoder/decoder is further configured to select the first page stripe, the second page stripe, or the third page stripe having the worst bit error rate for association with gear zero.

19. The apparatus of claim 11, wherein the third page stripe corresponds to the selected one of the first page stripe, the second page stripe, or the third page stripe, for association with gear zero, wherein:
the first circuit is further configured to perform a data integrity test on the first page stripe to determine a fourth estimated bit error rate (fourth BER) for the first page stripe and on the second page stripe to determine a fifth estimated bit error rate (fifth BER) for the second page stripe after the association with gear zero for the third page stripe;
the second circuit is further configured to select from at least the first gear, the second gear, or gear zero for association with the first page stripe based on the fourth BER; and
the second circuit is further configured to select from at least the first gear, the second gear, or gear zero for association with the second page stripe based on the fifth BER.

20. The apparatus of claim 19, wherein when at least one of the fourth BER or the fifth BER exceeds the second predetermined threshold, the second circuit is further configured to select the first page stripe or the second page stripe having the worse estimated bit error rate for association with gear zero.

* * * * *